US012266908B2

(12) United States Patent
Wotherspoon et al.

(10) Patent No.: US 12,266,908 B2
(45) Date of Patent: Apr. 1, 2025

(54) DEVICE INCLUDING A MULTIPLE-WAVELENGTH VERTICAL-CAVITY SURFACE-EMITTING LASER (VCSEL) ARRAY

(71) Applicants: Microchip Technology Caldicot Limited, Caldicot Monmothshire (GB); NPL Management Limited, Teddington Middlesex (GB)

(72) Inventors: Tracy Wotherspoon, Portskewett (GB); Daniel Graham, Bristol (GB); Robert Bowen, Caldicot (GB); Mohsin Haji, London (GB)

(73) Assignees: Microchip Technology Caldicot Limited, Caldicot (GB); NPL Management Limited, Teddington (GB)

( * ) Notice: Subject to any disclaimer, the term of this patent is extended or adjusted under 35 U.S.C. 154(b) by 115 days.

(21) Appl. No.: 18/119,077

(22) Filed: Mar. 8, 2023

(65) Prior Publication Data
US 2023/0291182 A1     Sep. 14, 2023

Related U.S. Application Data

(60) Provisional application No. 63/317,869, filed on Mar. 8, 2022.

(51) Int. Cl.
*H01S 5/42* (2006.01)
*G02B 27/30* (2006.01)
(Continued)

(52) U.S. Cl.
CPC .............. *H01S 5/423* (2013.01); *G02B 27/30* (2013.01); *H01S 5/0014* (2013.01); *H01S 5/005* (2013.01);
(Continued)

(58) Field of Classification Search
None
See application file for complete search history.

(56) References Cited

U.S. PATENT DOCUMENTS

| 5,963,568 A | * | 10/1999 | Paoli | ...................... H01S 5/423 |
| | | | | 372/96 |
| 8,159,736 B2 | * | 4/2012 | Maleki | .................. G02F 1/0353 |
| | | | | 359/239 |

(Continued)

FOREIGN PATENT DOCUMENTS

CN     107422287 B     8/2019     .............. G01R 33/26

OTHER PUBLICATIONS

International Search Report and Written Opinion, Application No. PCT/EP2023/055950, 19 pages, Sep. 7, 2023.
(Continued)

*Primary Examiner* — Jas A Sanghera
(74) *Attorney, Agent, or Firm* — SLAYDEN GRUBERT BEARD PLLC

(57) ABSTRACT

A device includes a multiple-wavelength (e.g., dual wavelength) vertical-cavity surface-emitting laser (VCSEL) array including a first VCSEL set including one or more first VCSEL to emit first VCSEL radiation at a first wavelength, and a second VCSEL set including one or more second VCSEL to emit second VCSEL radiation at a second wavelength different than the first wavelength. The device includes upstream optics to upstream optics to (a) collimate the first VCSEL radiation emitted by the first VCSEL set and (b) collimate the second VCSEL radiation emitted by the second VCSEL set. The device also includes a vapor cell to receive the collimated first VCSEL radiation and the collimated second VCSEL radiation and to provide an output beam as a function of the received collimated first VCSEL radiation and collimated second VCSEL radiation, and mea- (Continued)

surement circuitry to analyze the output beam provided by the vapor cell.

23 Claims, 12 Drawing Sheets

(51) Int. Cl.
  *H01S 5/00* (2006.01)
  *H01S 5/02253* (2021.01)
  *H01S 5/02315* (2021.01)
  *H01S 5/042* (2006.01)
  *H01S 5/40* (2006.01)
  *G01R 33/032* (2006.01)
  *G01S 3/781* (2006.01)

(52) U.S. Cl.
  CPC ...... *H01S 5/02253* (2021.01); *H01S 5/02315* (2021.01); *H01S 5/0425* (2013.01); *H01S 5/4006* (2013.01); *G01R 33/032* (2013.01); *G01S 3/781* (2013.01); *H01S 2302/00* (2013.01)

(56) References Cited

U.S. PATENT DOCUMENTS

| | | | |
|---|---|---|---|
| 8,212,556 B1* | 7/2012 | Schwindt | G01R 33/26 |
| | | | 324/304 |
| 10,274,549 B1 | 4/2019 | Ledbetter et al. | |
| 2007/0266784 A1* | 11/2007 | Lust | G01C 19/62 |
| | | | 73/504.05 |
| 2011/0044367 A1* | 2/2011 | Budd | H01L 27/1446 |
| | | | 257/E31.127 |
| 2020/0341081 A1 | 10/2020 | Mohseni et al. | |
| 2020/0400763 A1 | 12/2020 | Pratt | |
| 2021/0234342 A1* | 7/2021 | Donovan | G01S 17/10 |
| 2022/0052511 A1* | 2/2022 | Lu | G02B 27/30 |
| 2022/0085572 A1* | 3/2022 | Miller | H01S 5/02257 |

OTHER PUBLICATIONS

Partial International Search Report & Invitation to Pay Additional Fees, Application No. PCT/EP2023/055950, 13 pages, Jul. 17, 2023.

* cited by examiner

DEVICE INCLUDING A MULTIPLE-WAVELENGTH VERTICAL-CAVITY SURFACE-EMITTING LASER (VCSEL) ARRAY

RELATED APPLICATION

This application claims priority to commonly owned U.S. Provisional Patent Application No. 63/317,869 filed Mar. 8, 2022, the entire contents of which are hereby incorporated by reference for all purposes.

TECHNICAL FIELD

The present disclosure relates to laser-based devices, and more particularly to a device including a multiple-wavelength vertical-cavity surface-emitting laser (VCSEL) array to emit laser radiation at multiple different wavelengths.

BACKGROUND

Conventional navigation and guidance systems in GNSS deprived or weak regions, e.g., dense urban, remote mountainous, space, underwater, or underground regions, or potential GNSS compromised situations such as a battlefield, often utilize navigation and guidance information by triangulation with external sources, for example cell towers, commercial radio broadcast signals, Terrestrial Trunked Radio (TETRA) or distance estimates using inertial sensors. Other conventional devices generate navigation and/or guidance information using edge-emitting lasers in brass "butterfly" type packages, which are typical large, power hungry and expensive, making them a poor choice for miniaturized systems needed for mobile systems and projectiles, for example.

Governments and private entities have been investigating the use of quantum/laser-based systems for such purposes. For example, laser-based magnetometers using multiple laser wavelengths have recently been developed. In a typical system, two narrowband laser sources at different wavelengths are used to excite and sense changes in the spin of atoms in a vapor cell (sensing cell). In particular, a "pump laser" at a first wavelength and a "probe laser" at a second wavelength are used to respectively excite the vapor cell and generate an output beam. The output beam is polarized into vertical and horizontal components. Changes in amplitude of the vertical and horizontal polarized components of the output beam, associated with changes in the spin of atoms in the vapor cell, are detected, from which directional data of the magnetometer can be calculated.

However, traditional pump-probe laser systems sources are typically large, expensive lab-based devices, and may be too large and heavy for certain applications.

There is a need for improved multiple-wavelength laser sources, e.g., for any of the example applications mentioned above. For example, there is a need for a multiple-wavelength (e.g., dual wavelength) laser source small enough to fit in a projectile and with sufficiently high optical power to excite a respective sensing cell. As another example, there is a need for a multiple-wavelength laser source providing a stable compass/gyro, e.g., for use in guidance systems needing high stability (e.g., 0.03 degrees/hour). As another example, there is a need for optical systems with no moving parts for certain applications.

SUMMARY

The present disclosure provides a device including a multiple-wavelength (e.g., dual-wavelength) VCSEL array arranged on a PCB or other substrate, wherein the multiple-wavelength VCSEL array includes (a) a set of first VCSELs emitting first VCSEL radiation at a first wavelength, and (b) a set of second VCSELs emitting second VCSEL radiation at a second wavelength different than the first wavelength.

The device may include circuitry to control a current applied to individual first VCSELs and second VCSELs, e.g., to adjust the radiation emitted by respective individual first VCSELs and/or second VCSELs.

Examples of the present disclosure may provide various advantages over certain conventional designs. For example, some examples provide a multiple-wavelength VCSEL array and associated packaging that is significantly less expensive than traditional brass "butterfly" type packages used with edge-emitting lasers. As another example, some examples provide a collimating micro-lens array constructed as an integrated component, e.g., mounted to a PCB or other substrate by a spacer structure or "riser," as opposed to a conventional butterfly package in which such optics are provided as external components. As another example, in some examples using an array of multiple VCSELs overcomes the low optical power emitted from a single VCSEL, thus providing optical output suitable for certain applications, e.g., quantum gyroscope applications.

One aspect provides a device including a multiple-wavelength VCSEL array including a first VCSEL set including one or more first VCSEL to emit first VCSEL radiation at a first wavelength, and a second VCSEL set including one or more second VCSEL to emit second VCSEL radiation at a second wavelength different than the first wavelength. The device includes upstream optics to (a) collimate the first VCSEL radiation emitted by the first VCSEL set and (b) collimate the second VCSEL radiation emitted by the second VCSEL set. The device also includes a vapor cell to receive the collimated first VCSEL radiation and the collimated second VCSEL radiation and to provide an output beam as a function of the received collimated first VCSEL radiation and collimated second VCSEL radiation. The device also includes measurement circuitry to analyze the output beam provided by the vapor cell.

In one example, the second wavelength differs from the first wavelength by an amount in the range of 0.005 nm to 30 nm.

In one example, the second wavelength differs from the first wavelength by an amount in the range of 0.010 nm to 0.025 nm.

In one example, the collimated first VCSEL radiation defines a pump laser, and the collimated second VCSEL radiation defines a probe laser.

In one example, the multiple-wavelength VCSEL array is provided on a printed circuit board.

In one example, the upstream optics comprise a lens array including at least one first lens to collimate the first VCSEL radiation emitted by the first VCSEL set, and at least one second lens to collimate the second VCSEL radiation emitted by the second VCSEL set.

In one example, the multiple-wavelength VCSEL array is provided on a substrate, and the device comprises a spacer structure arranged between the substrate and the lens array, wherein the spacer structure holds the lens array spaced apart from the multiple-wavelength VCSEL array provided on the substrate.

In one example, the upstream optics include a quarter wave plate to polarize the first VCSEL radiation emitted by the first VCSEL set, and a half wave plate to polarize the second VCSEL radiation emitted by the second VCSEL set.

In one example, the upstream optics include at least one upstream optical element to direct the collimated first VCSEL radiation parallel to the collimated second VCSEL radiation.

In one example, the upstream optics include at least one upstream optical element to direct the collimated first VCSEL radiation non-parallel to the collimated second VCSEL radiation.

In one example, the first VCSEL set includes multiple first VCSELs, and the multiple first VCSELs are individually addressable.

In one example, the multiple first VCSELs are (a) connected to a common anode connection and individually addressable via individually addressable cathode connections, or (b) connected to a common cathode connection and individually addressable via individually addressable anode connections.

In one example, the device includes control circuitry to (a) apply a first current corresponding with the first wavelength to respective first VCSELs of the first VCSEL set and (b) apply a second current corresponding with the second wavelength to respective second VCSELs of the second VCSEL set.

In one example, the first VCSEL set and the second VCSEL set are surface-mounted on a substrate in the form of a land grid array.

In one example, the device comprises a magnetometer including downstream optics to separate the output beam provided by the vapor cell into a first output beam component and a second output beam component orthogonal to the first output beam component. The magnetometer also includes measurement circuitry to measure a first voltage associated with the first output beam component, measure a second voltage associated with the second output beam component, and analyze the first voltage and the second voltage to determine a directional orientation.

In one example, the device comprises a quantum navigation device. The quantum navigation device includes downstream optics to separate the output beam provided by the vapor cell into a first output beam component and a second output beam component orthogonal to the first output beam component. The quantum navigation device comprises measurement circuitry to analyze the first output beam component and the second output beam component to determine an angle of deviation from a reference point in a defined plane.

In one example, the device comprises an atomic clock, wherein the VCSEL array is modulated by a microwave frequency to excite a resonance of alkali atoms in the vapor cell, the output beam provided by the vapor cell is used to derive a phase-locked loop (PLL) signal, the measurement circuitry comprises a photodetector to measure an amplitude of the output beam to produce a frequency reference, and control circuitry to control the output microwave frequency of a frequency controllable oscillator.

One aspect provides a device including one or more first VCSEL to emit first VCSEL radiation at a first wavelength, and one or more second VCSEL to emit second VCSEL radiation at a second wavelength different than the first wavelength. The device also includes a lens array including (a) one or more first upstream optical elements to collimate the first VCSEL radiation, the collimated first VCSEL radiation defining a pump light and (b) one or more second upstream optical elements to collimate the second VCSEL radiation, the collimated second VCSEL radiation defining a probe light. The device includes a vapor cell downstream of the lens array to receive the pump light and the probe light and to provide an output beam, and measurement circuitry to analyze the output beam.

In one example, the one or more first VCSEL and the one or more second VCSEL are provided on a substrate, and the lens array is spaced apart from the one or more first VCSEL and the one or more second VCSEL by a spacer structure mounted on the substrate.

In one example, the one or more first VCSEL comprise multiple first VCSELs, wherein the multiple first VCSELs are individually addressable.

In one example, the device includes control circuitry to apply a first current corresponding with the first wavelength to the one or more first VCSEL, and apply a second current corresponding with the second wavelength to the one or more second VCSEL.

One aspect provides a method including applying a first current to a first VCSEL set including one or more first VCSEL, the first current causing the first VCSEL set to emit first VCSEL radiation at a first wavelength, and applying a second current to a second VCSEL set including one or more second VCSEL, the second current causing the second VCSEL set to emit second VCSEL radiation at a second wavelength different than the first wavelength. The method includes receiving the first VCSEL radiation and the second VCSEL radiation at a vapor cell, providing an output beam, by the vapor cell, as a function of the first VCSEL radiation and second VCSEL radiation, and analyzing the output beam produced by the vapor cell.

In one example, the method includes separating the output beam provided by the vapor cell into a first output beam component and a second output beam component orthogonal to the first output beam component, and wherein analyzing the output beam produced by the vapor cell includes measuring a first voltage associated with the first output beam component, measuring a second voltage associated with the second output beam component, and analyzing the first voltage and the second voltage.

In one example, the method includes collimating the first VCSEL radiation emitted by the first VCSEL set, and collimating the second VCSEL radiation emitted by the second VCSEL set, and wherein receiving the first VCSEL radiation and the second VCSEL radiation at the vapor cell comprises receiving the collimated first VCSEL radiation and the collimated second VCSEL radiation at the vapor cell.

In one example, applying the first current to the first VCSEL set to cause the first VCSEL set to emit first VCSEL radiation at the first wavelength comprises performing an optical injection locking technique to control respective first VCSELs to emit first VCSEL radiation at the first wavelength; and applying the second current to the first VCSEL set to cause the second VCSEL set to emit second VCSEL radiation at the second wavelength comprises performing an optical injection locking technique to control respective second VCSELs to emit second VCSEL radiation at the second wavelength.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
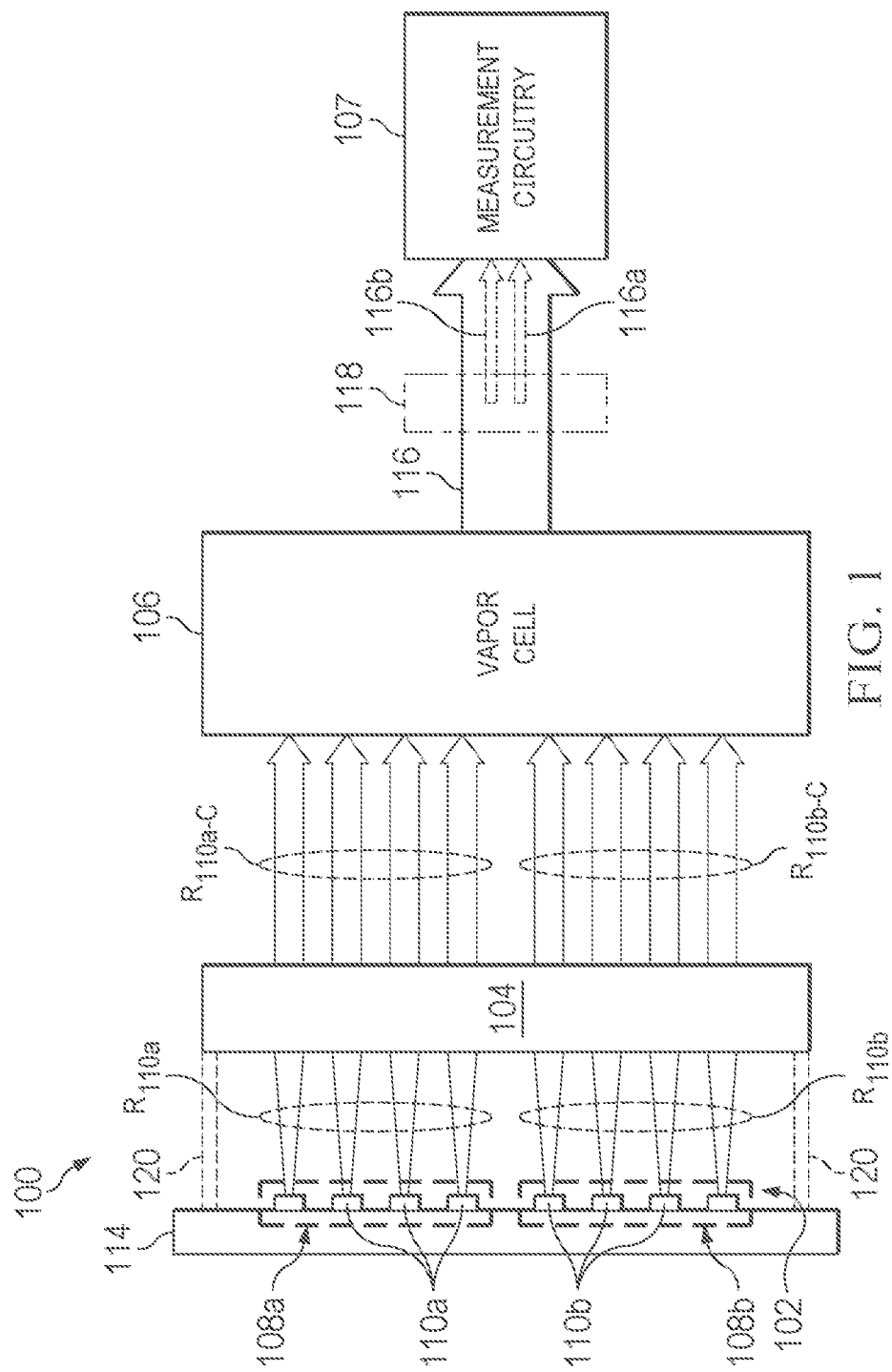
FIG. 1 shows an example device including a dual-wavelength VCSEL array for emitting radiation at two different wavelengths, according to one example.

FIG. 1 shows an example device 100 including a multiple-wavelength VCSEL array 102, upstream optics 104, a vapor cell 106, and measurement circuitry 107. As discussed below, in some examples the device 100 may comprise a magnetometer, a quantum navigation device, an object detection device (e.g., for finding weapons, submarines, or pipe cracks, without limitation), an atomic clock, or other device that utilizes laser radiation of at least two different wavelengths.

As shown in FIG. 1, the multiple-wavelength VCSEL array 102 may include multiple VCSELs that emit radiation at different wavelengths, including at least (a) a first VCSEL set 108a including one or more first VCSELs 110a that emit radiation R110a (also referred to herein as "first VCSEL radiation R110a") at a first wavelength, and (b) a second VCSEL set 108b including one or more second VCSELs 110b that emit radiation R110b (also referred to herein as "second VCSEL radiation R110b") at a second wavelength different than the first wavelength. In the following discussion, the one or more first VCSELs 110a and the one or more second VCSELs 110b are referred to in the plural ("first VCSELs 110a" and "second VCSELs 110b") for the sake of convenience, although it should be understood that in some examples the first VCSEL set 108a and the second VCSEL set 108b may respectively include only one VCSEL.

In the illustrated example, multiple-wavelength VCSEL array 102 includes two VCSEL sets (first VCSEL set 108a and second VCSEL set 108b) to emit radiation at two different wavelengths (the first wavelength and the second wavelength, respectively). Thus, the multiple-wavelength VCSEL array 102 is referred to below as a dual-wavelength VCSEL array. In other examples, the multiple-wavelength VCSEL array 102 may include any number of VCSEL sets to emit radiation at any number of different wavelengths. For example, the multiple-wavelength VCSEL array 102 may include three, four, or more VCSEL sets to emit radiation at three, four, or more different wavelengths. It should be understood any device described herein as including a dual-wavelength VCSEL array including two VCSEL sets to emit radiation at two different wavelengths may alternatively include a multiple-wavelength VCSEL array including multiple VCSEL sets (e.g., three, four, or more VCSEL sets) to emit radiation at multiple different wavelengths (e.g., three, four, or more different wavelengths).

A typical VCSEL emits radiation as a divergent beam, in particular a circularly symmetric divergent beam (e.g., in contrast to typical edge-emitting lasers). Thus, first VCSEL radiation $R_{110a}$ and second VCSEL radiation $R_{110b}$ may be emitted as respective divergent beams. In examples in which the first VCSEL set 108a includes multiple first VCSELs 110a, respective individual first VCSELs 110a may emit a respective divergent beam, e.g., as illustrated in FIG. 1, such that first VCSEL radiation $R_{110a}$ includes multiple divergent beams corresponding with the multiple first VCSELs 110a. Similarly, in examples in which the second VCSEL set 108b includes multiple second VCSELs 110b, respective individual second VCSELs 110b may emit a respective divergent beam, e.g., as illustrated in FIG. 1, such that second VCSEL radiation $R_{110b}$ includes multiple divergent beams corresponding with the multiple second VCSELs 110b.

As noted above, the first VCSELs 110a emit first VCSEL radiation $R_{110a}$ at a first wavelength, and the second VCSELs 110b emit radiation $R_{110b}$ at a second wavelength different than the first wavelength. The "first wavelength" may refer to a first wavelength band, or first range of wavelength values, defined by a first defined wavelength value plus/minus a margin of variance resulting from small inherent variations in wavelengths emitted by respective individual first VCSELs 110a. Similarly the "second wavelength" may refer to a second wavelength band, or second range of wavelength values, defined by a second defined wavelength value plus/minus a margin of variance resulting from small inherent variations in wavelengths emitted by respective individual second VCSELs 110b. A "defined" wavelength value may refer to a wavelength value specified in an operational specification associated with the device 100 or specified, selected, or set by a control system associated with the device 100 (e.g., a target wavelength value set by such control system).

In some examples the second wavelength being "different" than the first wavelength means the second defined wavelength value differs from the first defined wavelength value by at least 0.005 nanometer (nm), for example in an implementation or configuration in which inherent differences (resulting from inherent variations between respective individual VCSELs) between the emitted wavelengths of individual first VCSELs 110a, and inherent differences between the emitted wavelengths of individual second VCSELs 110b, are less than 0.005 nm.

In some examples the second wavelength being "different" than the first wavelength means the second defined wavelength value differs from the first defined wavelength value by at least 0.010 nm.

In some examples, the second defined wavelength value differs from the first defined wavelength value by an amount in the range of 0.005 nm to 30 nm, or in the range of 0.010 nm to 30 nm, for example based on an amount by which the emitted wavelength of respective VCSELs could be adjusted as a function of applied current and/or temperature variation (e.g., about +15 nm per VCSEL for certain VCSEL devices). In some examples, the emitted wavelength of respective VCSELs may be adjustable as a function of applied current according to the relationship one nanometer per milliamp (1 nm/mA), and/or as a function of the respective VCSEL substrate temperature according to the relationship 0.1 nanometer per degree (0.1 nm/K). The values of 1 nm/mA and 0.1 nm/K are examples only; the exact values may be influenced by the respective VCSEL chip design and/or other factors. For example, in one example the emitted wavelength of respective VCSELs may be adjustable as a function of applied current according to the relationship 0.6 nm/mA, and as a function of the respective VCSEL substrate temperature according to the relationship 0.05 nm/K.

In some examples, the second defined wavelength value differs from the first defined wavelength value by an amount in the range of 0.010 nm to 1 nm, or in the range of 0.010 nm to 0.025 nm, for example in examples using cesium or rubidium in the vapor cell 106. In some specific examples, the second defined wavelength value differs from the first defined wavelength value by an amount in the range of 0.014 nm to 0.019 nm.

Based on the above, the first wavelength band (or first range of wavelength values) defining the first wavelength (i.e., the first defined wavelength value plus/minus a margin of variance resulting from inherent variations in emitted wavelength between individual VCSELs in an array) may be fully distinct from, i.e., not overlapping, the second wavelength band (or second range of wavelength values) defining the second wavelength (i.e., the second defined wavelength value plus/minus a margin of variance resulting from small inherent variations in emitted wavelength between individual VCSELs in an array).

In some examples, e.g., where the first VCSEL set 108a is provided to provide a pump laser and the second VCSEL set 108b is provided to provide a probe laser, (a) the first VCSELs 110a may be controlled to emit first VCSEL radiation $R_{110a}$ at a first wavelength defined by a D1 line or D2 line associated with the particular gas in the vapor cell 106, and (b) the second VCSELs 110b may be controlled to emit second VCSEL radiation $R_{110b}$ at a second wavelength offset from (different than) the first wavelength by at least any of the respective minimum amounts or ranges of values listed above.

In one particular example device 100 including cesium in the vapor cell 106, the first VCSELs 110a may be controlled to emit first VCSEL radiation $R_{110a}$ at a first defined wavelength value of ~852 nm (e.g., corresponding with the D2 line for cesium), and the second VCSELs 110b may be controlled to emit second VCSEL radiation $R_{110b}$ at a second defined wavelength value offset from (different from) the first defined wavelength value by a defined offset, wherein the defined offset may be in the range of 0.010 nm to 0.025 nm, for example in the range of 0.017179 nm to 0.018391 nm. In another particular example device 100 including cesium in the vapor cell 106, the first VCSELs 110a may be controlled to emit first VCSEL radiation $R_{110a}$ at a first defined wavelength value of ~895 nm (e.g., corresponding with the D1 line for cesium), and the second VCSELs 110b may be controlled to emit second VCSEL radiation $R_{110b}$ at a second defined wavelength value offset from (different from) the first defined wavelength value by a defined offset, wherein the defined offset may be in the range of 0.010 nm to 0.025 nm, for example in the range of 0.015812 nm to 0.017024 nm.

In another particular example device 100 including rubidium in the vapor cell 106, the first VCSELs 110a may be controlled to emit first VCSEL radiation $R_{110a}$ at a first defined wavelength value of ~780 nm (e.g., corresponding with the D2 line for rubidium), and the second VCSELs 110b may be controlled to emit second VCSEL radiation $R_{110b}$ at a second defined wavelength value offset from (different from) the first defined wavelength value by a defined offset, wherein the defined offset may be in the range of 0.010 nm to 0.025 nm, for example in the range of 0.015171 nm to 0.016226 nm. In another example device 100 including rubidium in the vapor cell 106, the first VCSELs 110a may be controlled to emit first VCSEL radiation $R_{110a}$ at a first defined wavelength value of ~795 nm (e.g., corresponding with the D1 line for rubidium), and the second VCSELs 110b may be controlled to emit second VCSEL radiation $R_{110b}$ at a second defined wavelength value offset from (different from) the first defined wavelength value by a defined offset, wherein the defined offset may be in the range of 0.010 nm to 0.025 nm, for example in the range of 0.014495 nm to 0.015549 nm.

In some examples, the first VCSELs 110a and second VCSELs 110b are structurally and functionally the same or similar. In some examples, the first VCSELs 110a and second VCSELs 110b may comprise pre-tested, pre-selected single mode VCSELs, e.g., selected by bin selection of similar dies with similar test data. In some examples, the first VCSELs 110a and second VCSELs 110b may be taken (e.g., picked and placed) from the same wafer lot. The first wavelength of first VCSEL radiation $R_{110a}$ emitted by first VCSELs 110a and the second wavelength of second VCSEL radiation $R_{110b}$ emitted by second VCSELs 110b may be set or defined by a respective current applied to the first VCSELs 110a and the second VCSELs 110b, respectively, e.g., as opposed to differences in the structure or functionality of the first VCSELs 110a versus the second VCSELs 110b. For example, a first current may be supplied to the first VCSELs 110a to cause the first VCSELs 110a to emit radiation at the first wavelength, and a second current (different than the first) may be supplied to the second VCSELs 110b to cause the second VCSELs 110b to emit radiation at the second wavelength different than the first wavelength. Analogous to the discussion above regarding the "first wavelength" and "second wavelength," the "first current" may refer to a first range of current values defined by a first defined current value plus/minus a margin of variance, for example resulting from small current adjustments, or noise, applied to individual first VCSELs 110a, e.g., to attain or attempt to attain the first defined wavelength value. Similarly the "second wavelength" may refer to a second range of reference current value defined by a second defined current value plus/minus a margin of variance, for example resulting from small current adjustments, or noise, applied to individual second VCSELs 110b, e.g., to attain or attempt to attain the second defined wavelength value. In some examples the second current (i.e., the second range of reference current value defined by the second defined current value plus/minus a margin of variance) is fully distinct from, i.e., does not overlap, the first current (i.e., the first range of reference current value defined by the first defined current value plus/minus a margin of variance).

In some examples, device 100 may include control circuitry (e.g., control circuitry 204 shown in FIGS. 2A-2C discussed below) to adjust the current applied to different individual VCSELs 110a or 110b, or different subgroups of VCSELs 110a or 110b, e.g., to account for minute differences between different VCSEL dies. For example, the control circuitry may adjust respective first VCSELs 110a to operate at the first defined wavelength, and adjust respective second VCSELs 110b to operate at the first defined wavelength.

In other examples, the first VCSELs 110a may be structurally or functionally different than the second VCSELs 110b. For example, the first VCSELs 110a and second VCSELs 110b may be manufactured and/or selected such that the first VCSELs 110a and second VCSELs 110b emit radiation at different wavelengths (i.e., the first VCSELs 110a emit at a first wavelength and the second VCSELs 110b emit at a second wavelength different that the first wavelength) in response to the same current applied to both the first VCSELs 110a and second VCSELs 110b. In such example the first VCSELs 110a and second VCSELs 110b may comprise pre-tested, pre-selected single mode VCSELs that emit a specified first wavelength and (different) second wavelength based on the same applied current.

In some examples, the dual-wavelength VCSEL array 102, including the first VCSEL set 108a including first VCSELs 110a and the second VCSEL set 108b including second VCSELs 110b, is provided on a common substrate 114, e.g., a printed circuit board (PCB). For example, the first VCSELs 110a and second VCSELs 110b may be formed or mounted on the common substrate 114, e.g., PCB.

In some examples, the first VCSEL radiation $R_{110a}$ at the first wavelength defines a pump laser, and the second VCSEL radiation $R_{110b}$ at the second wavelength defines a probe laser, e.g., in examples in which the device 100 comprises a magnetometer, a quantum navigation device, an object detection device, or an atomic clock. Thus, the dual-wavelength VCSEL array 102, e.g., provided on a common PCB or other substrate 114, may produce both a pump laser (comprising first VCSEL radiation $R_{110a}$) and a probe laser (comprising second VCSEL radiation $R_{110b}$). In some examples, using a respective group of multiple VCSELs for the pump laser (multiple first VCSELs 110a) and a respective group of multiple VCSELs for the probe laser (multiple second VCSELs 110b) can provide sufficient power to excite the vapor cell 106, whereas a single VCSEL for the pump laser or probe laser may provide insufficient output optical power to effectively excite the vapor cell 106 for certain applications.

Device 100 may include at least one power supply and control circuitry for controlling a current applied to respective first VCSELs 110a and second VCSELs 110b to cause the first VCSELs 110a and second VCSELs 110b to emit radiation at the first wavelength and second wavelength, respectively, e.g., as discussed below with respect to FIGS. 2A-2C.

Upstream optics 104 are arranged upstream of the vapor cell 106 to influence the first VCSEL radiation $R_{110a}$ and second VCSEL radiation $R_{110b}$ before delivery to the vapor cell 106, e.g., to deliver the first VCSEL radiation $R_{110a}$ and second VCSEL radiation $R_{110b}$ to the vapor cell 106 in a desired manner, e.g., with a desired beam shape, intensity, direction (e.g., optical axis), collimation, polarization, and/or other desired characteristics. Upstream optics 104 may include any number of type(s) of optical elements, for example one or more lenses, mirrors, filters, prisms, diffusers, polarizers (e.g., wave plates), and/or other elements capable of influencing a radiation beam. The terms upstream optics, and downstream optics, respectively, are defined in relation to vapor cell 106, such the optics between the VCSEL array 102 and the vapor cell 106 are considered upstream optics, and optics downstream of the vapor cell 106 are considered downstream optics.

In some examples, upstream optics 104 function to (a) collimate the first VCSEL radiation $R_{110a}$ to define collimated first VCSEL radiation $R_{110a\text{-}C}$ and (b) collimate the second VCSEL radiation $R_{110b}$ to define collimated second VCSEL radiation $R_{110b\text{-}C}$. As used herein, to "collimate" a respective input beam (i.e., a beam of radiation incident at a respective optical element of upstream optics 104) means to reduce a divergence of the input beam in at least one direction (e.g., at least one direction perpendicular to an optical axis of the beam), to propagate an output beam that is less divergent than the input beam, parallel, or convergent in the at least one direction. Thus, the first VCSEL radiation $R_{110a\text{-}C}$ output by upstream optics 104 may be, in at least one direction, either parallel, convergent, or otherwise less divergent than the first VCSEL radiation $R_{110a}$ incident at upstream optics 104. Similarly, the second VCSEL radiation $R_{110b\text{-}C}$ output by upstream optics 104 may be, in at least one direction, either parallel, convergent, or otherwise less divergent than the second VCSEL radiation $R_{110b}$ incident at upstream optics 104.

In some examples, e.g., as discussed below with reference to FIGS. 2A and 2B, upstream optics 104 include a lens array including a first set of lenses to collimate first VCSEL radiation $R_{110a}$ received from respective first VCSELs 110a and a second set of lenses to collimate second VCSEL radiation $R_{110b}$ received from respective second VCSELs 110b. In some examples, the first set of lenses may include a respective lens corresponding with the respective divergent beam emitted by each respective first VCSEL 110a, and the second set of lenses may include a respective lens corresponding with the respective divergent beam emitted by each respective second VCSEL 110b. The first set of lenses and second set of lenses may be (a) provided in or on a common structure (e.g., a micro-lens array including an array of lenses on a common substrate), or (b) provided on two or more separate structures (e.g., a first micro-lens array including the first set of lenses provided on a first substrate and a second micro-lens array (separate from the first micro-lens array) including the second set of lenses provided on a second substrate. As used herein, lenses may include "lenslets," a commonly used term referring to small lenses or respective lenses within a lens array.

In some examples, in addition to collimating the first VCSEL radiation $R_{110a}$ and second VCSEL radiation $R_{110b}$, upstream optics 104 may include optical elements to otherwise influence the first VCSEL radiation $R_{110a}$ and/or the second VCSEL radiation $R_{110b}$, e.g., to redirect, focus, separate, invert, rotate, disperse, diffuse, polarize, and/or filter the respective radiation. For example, upstream optics 104 may include at least one lens to both collimate and redirect a respective input beam (e.g., first VCSEL radiation $R_{110a}$ emitted by a respective first VCSEL 110a or second VCSEL radiation $R_{110b}$ emitted by respective second VCSEL 110b). For example, as discussed below with reference to FIG. 2C, upstream optics 104 include a micro-lens array including (a) a first array of lenses to (i) collimate first VCSEL radiation $R_{110a}$ emitted by first VCSELs 110a and (ii) direct the collimated first VCSEL radiation $R_{110a\text{-}C}$ in a first direction, and (b) a second array of lenses to (i) collimate second VCSEL radiation $R_{110b}$ emitted by second VCSELs 110b and (ii) direct the collimated second VCSEL radiation $R_{110b\text{-}C}$ in a second direction non-parallel to the first direction.

As used herein, radiation that is collimated by respective collimating optics (or upstream optics 104) is referred to as "collimated radiation" regardless of other concurrent or subsequent optical influence on the respective radiation. For instance, in the example discussed below with reference to FIG. 2A, radiation $R_{110a}$ and $R_{110b}$ collimated by respective lens arrays 220 and 250 is referred to as collimated radiation $R_{110a\text{-}C}$ and $R_{110b\text{-}C}$ both before and after being further influenced by respective lenses 230a, 230b and/or reflective optics (e.g., mirrors) 244.

As another example, upstream optics 104 may include elements distinct from the collimating optics. In some examples, upstream optics 104 may include polarizing optics to polarize the first VCSEL radiation $R_{110a}$ and/or second VCSEL radiation $R_{110b}$ (e.g., before or after being collimated by respective collimating optics). For example, as discussed below with reference to FIGS. 2A-2C, in an example in which the first VCSEL set 108a is provided to produce a pump laser and the second VCSEL set 108b is provided to produce a probe laser, upstream optics 104 may include (a) a quarter wave plate 228a (upstream or downstream of respective collimating optics, e.g., lens array 220 or lens array 250) for a circular polarization of first VCSEL radiation $R_{110a}$, and (b) a half wave plate 228b (upstream or downstream of respective collimating optics, e.g., lens array 220 or lens array 250) for a linear polarization of second VCSEL radiation $R_{110b}$.

As another examples, upstream optics 104 may include at least one mirror upstream or downstream from the collimating optics, to direct or redirect the collimated first VCSEL radiation $R_{110a\text{-}C}$ and/or the collimated second VCSEL radiation $R_{110b\text{-}C}$ toward specific locations (e.g., input openings) at the vapor cell 106. For example, upstream optics 104 may include mirror(s) or other optical element(s) to direct or redirect the collimated first VCSEL radiation $R_{110a\text{-}C}$ and/or collimated second VCSEL radiation $R_{110b\text{-}C}$ to provide a perpendicular relative orientation of the collimated first VCSEL radiation $R_{110a\text{-}C}$ and collimated second VCSEL radiation $R_{110b\text{-}C}$ (i.e., wherein an optical axis of the collimated first VCSEL radiation $R_{110a\text{-}C}$ propagates perpendicular to an optical axis of the collimated second VCSEL radiation $R_{110b\text{-}C}$), for example to deliver the collimated first VCSEL radiation $R_{110a\text{-}C}$ and collimated second VCSEL radiation $R_{110b\text{-}C}$ to the vapor cell 106 in a perpendicular relative orientation.

As shown in FIG. 1, the device 100 may optionally include a spacer structure 120 (e.g., a riser) that holds component of upstream optics 104 spaced apart from the dual-wavelength VCSEL array 102 by a defined distance, e.g., to provide desired optical effects of the upstream optics 104 on the first VCSEL radiation $R_{110a}$ and/or second VCSEL radiation $R_{110b}$. For example, the spacer structure 120 may be mounted to the substrate 114 and may physically support a collimating micro-lens array (example upstream optics 104) at a selected distance away from laser emitting surfaces of the dual-wavelength VCSEL array 102, e.g., based on the angular divergence of beams emitted by respective VCSELs 110a, 110b and the dimensions of respective micro-lenses in the array of upstream optics 104. In addition, in some examples the spacer structure 120 may physically surround the dual-wavelength VCSEL array 102 to block out external light.

The vapor cell 106 may receive the collimated first VCSEL radiation $R_{110a\text{-}C}$ and collimated second VCSEL radiation $R_{110b\text{-}C}$ (which have been collimated, polarized and/or otherwise influenced by upstream optics 104 as discussed above), and provide an output beam 116 as a function of the received collimated first VCSEL radiation $R_{110a\text{-}C}$ and the received collimated second VCSEL radiation $R_{110b\text{-}C}$. In some examples, the vapor cell 106 may comprise rubidium (Rb), cesium (Cs), xenon (Xe), or other suitable vapor or gas.

In some examples, device 100 may include optional downstream optics 118 to manipulate or influence the output beam 116. Downstream optics 118 may include any number of type(s) of optical elements, for example one or more lenses, mirrors, filters, prisms, diffusers, polarizers, and/or other elements capable of influencing a radiation beam. In some examples, downstream optics 118 may include polarizers or other optics to separate the output beam 116 into two orthogonal components (e.g., a horizontal component and a vertical component) for analysis by downstream measurement circuitry 107. For example, downstream optics 118 may (optionally) include a half wave plate. In some examples, downstream optics 118 may (optionally) include a polarizing beam splitter to separate the output beam 116 into a first output beam component 116a (e.g., a horizontal component, 116a not shown) and a second output beam component 116b (e.g., a vertical component, 116b not shown) orthogonal to the first output beam component 116a.

Measurement circuitry 107 includes circuitry to analyze the output beam 116 provided by the vapor cell 106. For example, measurement circuitry 107 may include photodiodes and transimpedance amplifiers to convert an optical power of output beam 116 (or respective components of output beam 116) to voltage(s), e.g., for determining a three-dimensional direction or orientation. In examples including downstream optics 118 to separate the output beam 116 into a first output beam component 116a (e.g., a horizontal component) and a second output beam component 116b (e.g., a vertical component), measurement circuitry 107 may include circuitry to measure a first voltage associated with the first output beam component 116a, measure a second voltage associated with the second output beam component 116b, and analyze the first voltage and the second voltage to determine orientation information or other useful information. In one example, downstream optics 118 may include (a) a first photodiode and a first transimpedance amplifier to convert an optical power of the first output beam component 116a (e.g., horizontal component) to a first voltage indicating a first magnetic field (e.g., a horizontal magnetic field), (b) a second photodiode and a second transimpedance amplifier to convert an optical power of the second output beam component 116b (e.g., vertical component) to a second voltage indicating a second magnetic field (e.g., a vertical magnetic field), and (c) circuitry to compare the first and second voltages to determine an angle of deviation in two directions, i.e., to determine a three-dimensional direction or orientation of the respective device. Accordingly, references herein to measuring a voltage associated with a respective beam or beam component may refer to measuring an optical power (e.g., photocurrent) and converting the optical power to voltage, e.g., using a transimpedance amplifier.

In one example, the device comprises a magnetometer including downstream optics to separate the output beam provided by the vapor cell into a first output beam component and a second output beam component orthogonal to the first output beam component. The magnetometer also includes measurement circuitry to measure a first voltage associated with the first output beam component, measure a second voltage associated with the second output beam component, and analyze the first voltage and the second voltage to determine a directional orientation.

In some examples, the output of first VCSELs 110a is circularly polarized, for example using a quarter wave plate. This beam (pump laser) may be used to excite outer shell electrons of gas in the vapor cell 106 (e.g., rubidium (Rb), cesium (Cs), xenon (Xe), or other suitable vapor or gas) so the electrons spin in the same direction. In some examples, the probe beam from the second VCSELs 110b is linearly polarized at an angle (e.g., 45 degrees) before entering the vapor cell 106, for example using a half wave plate set at an angle. The output beam from the vapor cell may have a carrier amplitude that is modulated in some manner (e.g., amplitude and/or phase) by changes in the electron spin. The output beam from the vapor cell may be resolved into horizontal and vertical components.

In an example in which device 100 comprises a magnetometer, downstream optics 118 may beam splitters and waveplates. To determine the strength of an ambient magnetic field, the probe beam may be passed through these downstream optics 118 after passing through the vapor cell 106, to separate the beam into a vertically polarized component and a horizontally polarized component. The measurement circuitry 107 may include two photodiodes for each component (i.e., the vertically polarized component and horizontally polarized component) to determine the power of each component. The measurement circuitry 107 may determine a difference in the determined power of the vertical and horizontal components (e.g., using an instrumentation amplifier), and determine the strength of the magnetic field as a function of the determined difference between the vertical component power and horizontal component power.

In an alternative example the measurement circuitry 107 may measure a changing phase relationship, wherein the probe laser may be modulated to act as a reference phase, and a phase detector circuit may be used to compare the phase of the measured signal to the reference signal.

In other examples, device 100 may comprises an atomic clock. The VCSEL array 102 may be modulated by a microwave frequency to excite a resonance of alkali atoms in the vapor cell 106, wherein the output beam 116 provided by the vapor cell 106 is used to derive a phase-locked loop (PLL) signal. The measurement circuitry 107 may comprise a photodetector to measure an amplitude of the output beam 116 to produce a "frequency reference" which may be used by suitable control circuitry to control the output frequency of a frequency tunable oscillator (for example, a voltage controlled crystal oscillator (VCXO), a coaxial resonator oscillator (CRO), a dielectric resonator oscillator (DRO), a Wien bridge oscillator, or an LC circuit) to control the microwave frequency (e.g., to lock the microwave sources to the vapor cell 106 resonance).

Figure 2A:
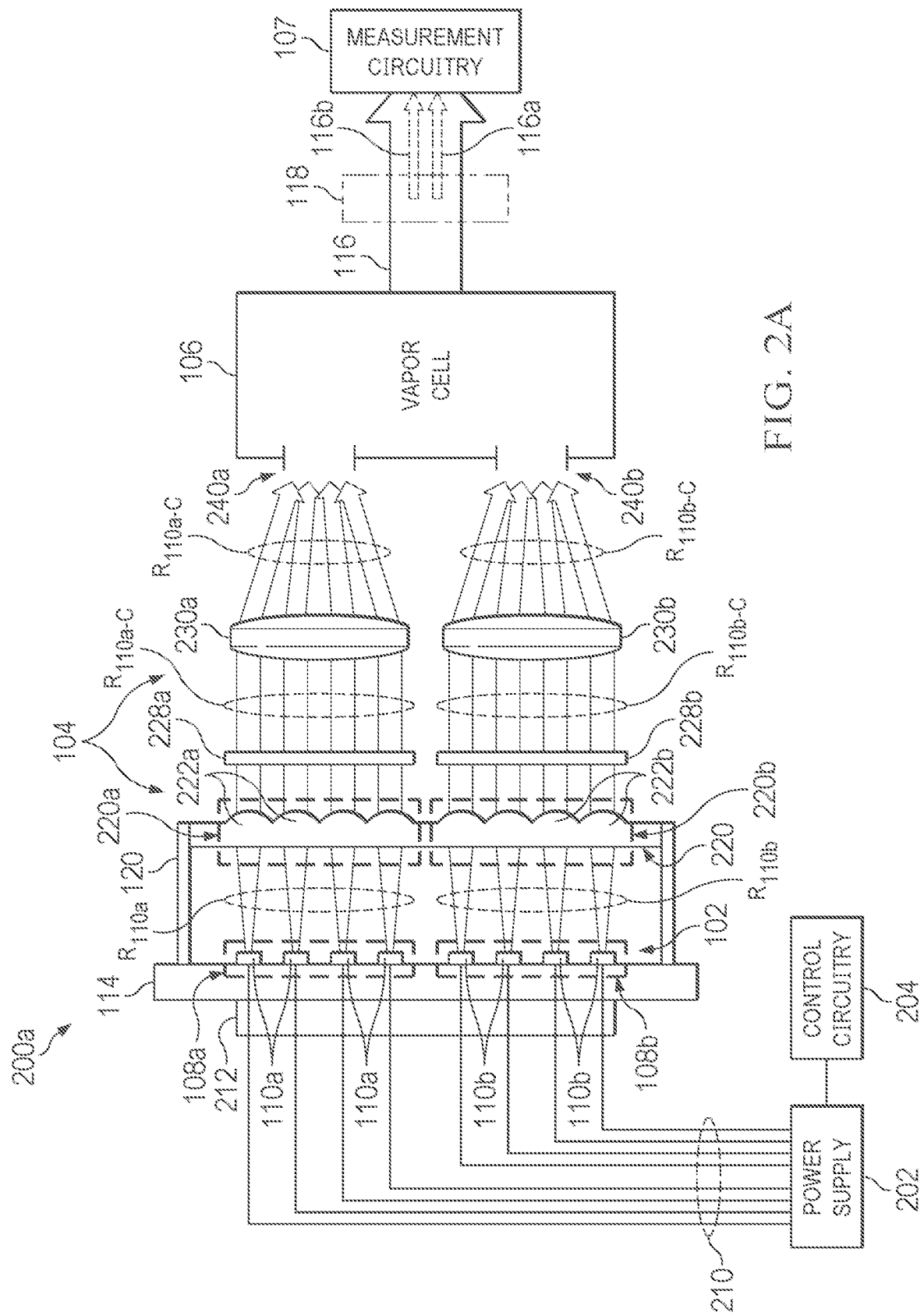
FIGS. 2A-2C illustrate example devices incorporating the features of the example device of FIG. 1, along with additional example features.
Figure 2B:
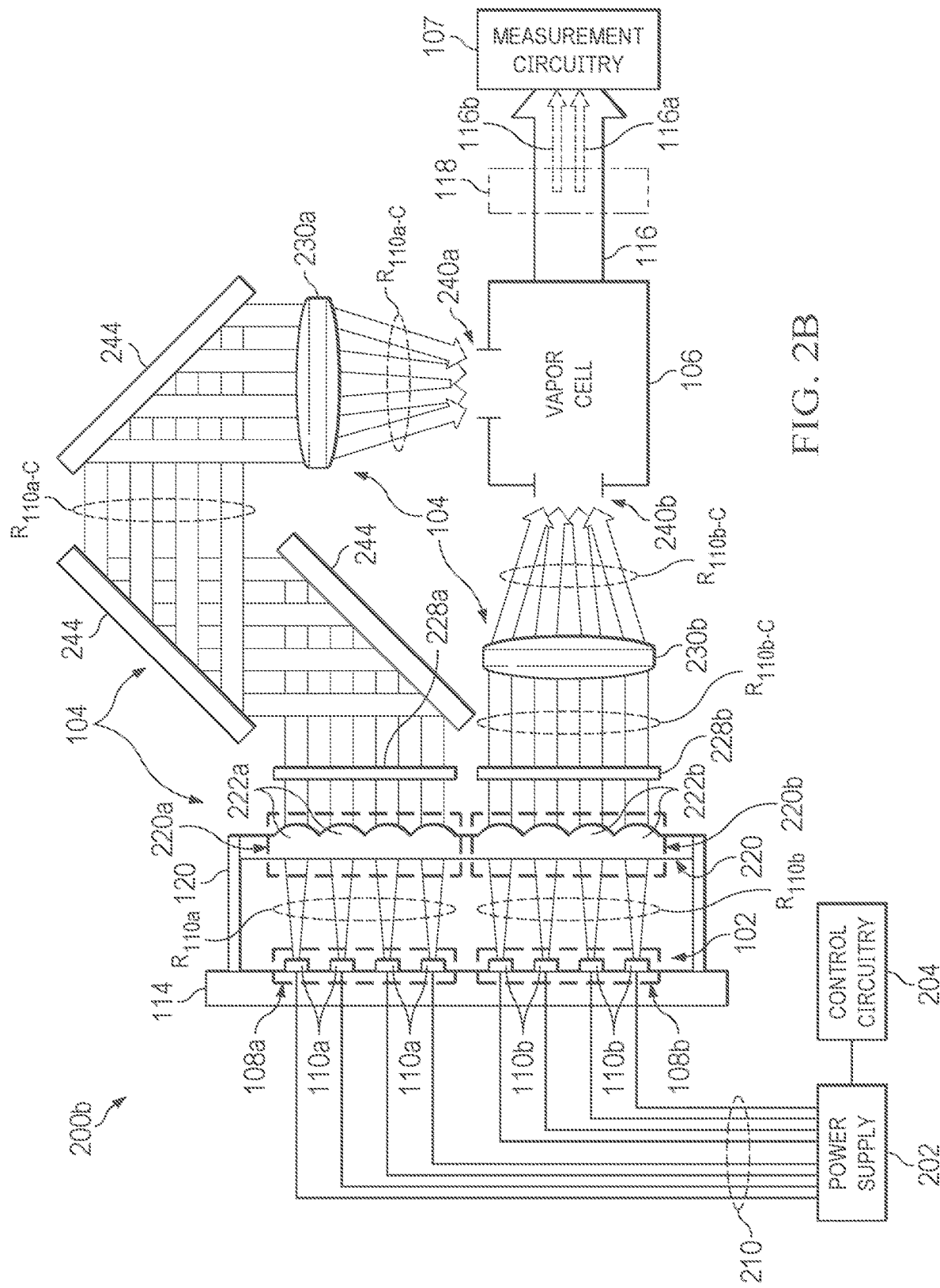
Figure 2C:
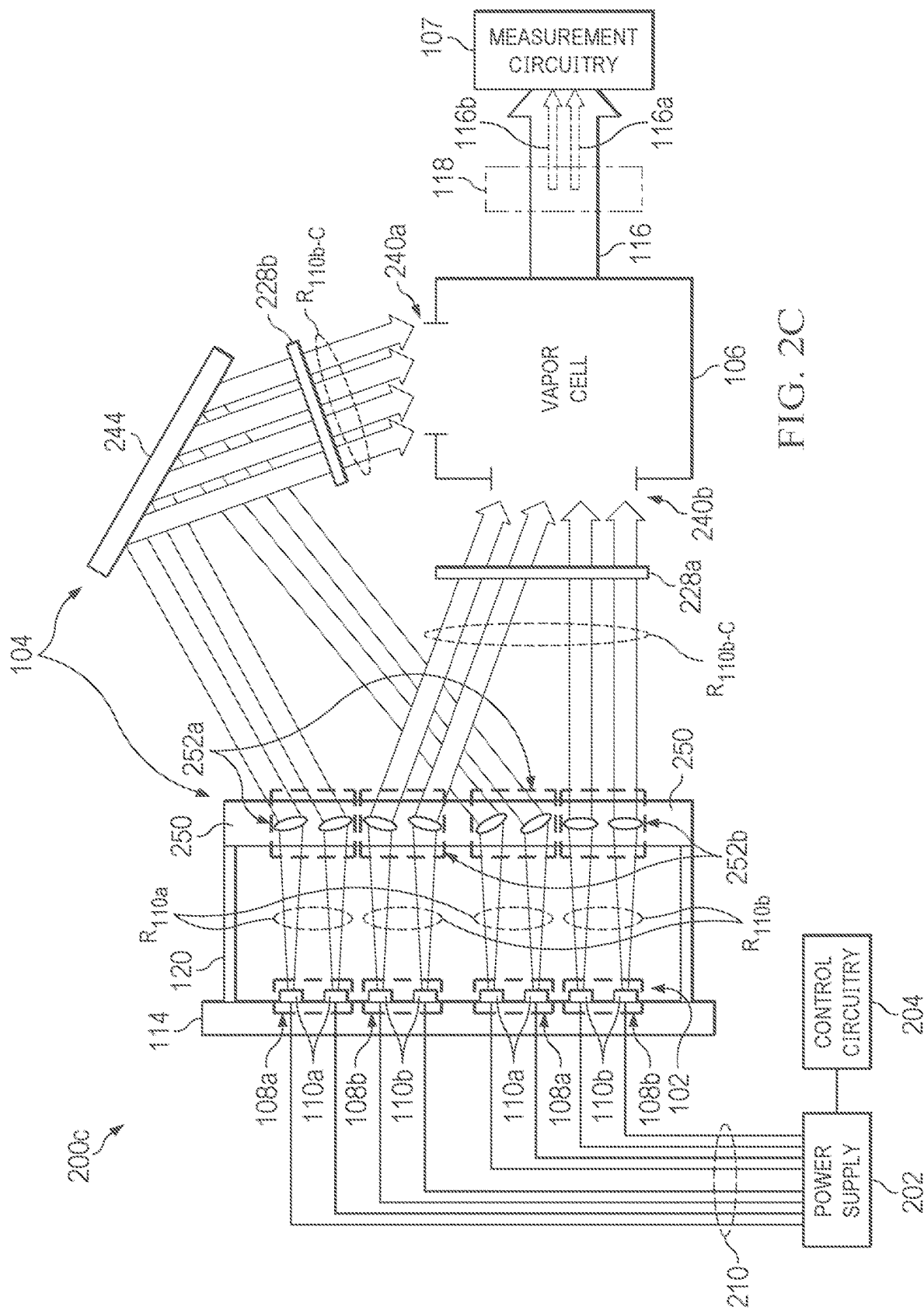

FIGS. 2A-2C illustrate example devices 200a, 200b, and 200c, respectively, incorporating the features of example device 100, along with additional example features. Example devices 200a, 200b, and 200c each include the multiple-wavelength (e.g., dual-wavelength) VCSEL array 102 mounted on substrate 114, upstream optics 104, vapor cell 106, optional downstream optics 118, and measurement circuitry 107 as discussed above. Example devices 200a, 200b, and 200c also include at least one power supply 202 and control circuitry 204 for controlling a respective current applied to respective first VCSELs 110a and second VCSELs 110b to cause the first VCSELs 110a and second VCSELs 110b to emit radiation at desired wavelength(s). For example, control circuitry 204 may apply a first current corresponding with a first wavelength to respective first VCSELs 110a, and apply a second current corresponding with a second wavelength (different from the first wavelength, e.g., as discussed above) to respective second VCSELs 110b.

As discussed above, in some examples, control circuitry 204 may adjust the current applied to different individual VCSELs 110a or 110b, or different subgroups of VCSELs 110a or 110b, to operate the respective VCSELs 110a or 110b at the target wavelength (e.g., to operate respective first VCSELs 110a at the first defined wavelength, and/or to operate respective second VCSELs 110b at the second defined wavelength), e.g., to compensate for minute differences between different VCSEL dies. Control circuitry 204 may make fine adjustments to the current applied to respective VCSELs 110a and/or 110b to operate at the desired wavelengths. In some examples, the control circuitry includes an optical injection locking system to shine a "master" laser at a group of VCSELs 110a or 110b ("slave lasers") to force them to operate at the same target wavelength (e.g., to operate first VCSELs 110a at the first defined wavelength and the second VCSELs 110b at the second defined wavelength). In some examples, the master laser may be a designated VCSEL 110a or 110b in the VCSEL array 102. In other examples, the master laser may be separate (e.g., external) from device 100.

In the examples devices 200a, 200b, and 200c shown respectively in FIGS. 2A-2C, the respective multiple-wavelength VCSEL array 102 is a dual-wavelength VCSEL array including two VCSEL sets to emit radiation at two different wavelengths. In other examples, devices 200a, 200b, and 200c may include a multiple-wavelength VCSEL array including any number of VCSEL sets (e.g., three, four, or more VCSEL sets) to emit radiation at any number of different wavelengths (e.g., three, four, or more different wavelengths).

In some examples, individual first VCSELs 110a and/or individual second VCSELs 110b are individually controllable, e.g., to individually adjust or "tune" a respective wavelength emitted by respective individual VCSELs, for example to adjust independent VCSELs toward a respective defined wavelength. In the illustrated example, respective cathodes or anodes of individual first VCSELs 110a and/or individual second VCSELs 110b are individually addressable, e.g., as indicated by VCSEL-specific connections 210 (e.g., VCSEL-specific cathode connections or VCSEL-specific anode connections), to allow independent control of individual first VCSELs 110a and/or individual second VCSELs 110b. First VCSELs 110a and second VCSELs 110b may be collectively connected to a common anode or a common cathode (or alternatively first VCSELs 110a may be collectively connected to a first common anode or first common cathode, and second VCSELs 110b may be collectively connected to a second common anode or second common anode). Control circuitry 204 may include a digitally-controlled programmable multi-channel current driver (e.g., embodied in an application specific integrated circuit (ASIC) or discrete components) to independently control a respective current applied to individual VCSELs 110a, 110b over respective VCSEL-specific connections 210.

As used herein, an "individual" VCSEL may refer to a single first VCSEL 110a or second VCSEL 110b, or a partial subset of the first VCSEL set 108a or second VCSEL set 108b (e.g., two, three, or more first VCSEL 110a or second VCSELs 110b of a larger first VCSEL set 108a or second VCSEL set 108b, respectively).

Example devices 200a, 200b, and 200c may include various thermal management components, e.g., as discussed in more detail below with respect to FIGS. 3A and 3B. As shown in FIG. 2A, example devices 200a, 200b, and 200c may optionally include an thermoelectric cooling device 212 mounted to a back side of the substrate 114, i.e., opposite a front side on which the first and second VCSELs 110a, 110b are mounted, to facilitate heat removal from the dual-wavelength VCSEL array 102.

FIGS. 2A-2C also illustrate various examples of upstream optics 104 included in example devices 200a, 200b, and 200c, respectively. Turning first to FIG. 2A, upstream optics 104 of example device 200a includes a micro lens array 220, an optional quarter wave plate 228a, an optional half wave plate 228b, and an optional pair of lenses 230a and 230b. The micro lens array 220 includes a first portion 220a including a set of first micro-lenses 222a corresponding with the first VCSEL set 108a and a section portion 220b including a set of second micro-lenses 222b corresponding with the second VCSEL set 108b. The set of first micro-lenses 222a includes a respective first micro-lens 222a corresponding with a respective first VCSEL 110a, with the respective first micro-lens 222a collimating a divergent beam of first VCSEL radiation $R_{110a}$ emitted by a corresponding first VCSEL 110a to define a respective beam of collimated first VCSEL radiation $R_{110a-C}$, and the set of second micro-lenses 222b includes a respective second micro-lens 222b corresponding with a respective second VCSEL 110b, with the respective second micro-lens 222b collimating a divergent beam of second VCSEL radiation $R_{110b}$ emitted by a corresponding second VCSEL 110b to define a respective beam of collimated second VCSEL radiation $R_{110b-C}$. In this example, the first micro-lenses 222a and second micro-lenses 222b propagate the collimated beams parallel to each other.

The optional quarter wave plate 228a may be provided for circular polarization of the collimated first VCSEL radiation $R_{110a-C}$, e.g., for a pump laser provided to the vapor cell 106, and the optional half wave plate 228b may be provided for linear polarization of the collimated second VCSEL radiation $R_{110b-C}$, e.g., for a probe laser provided to the vapor cell 106. In another example, the quarter wave plate 228a and half wave plate 228b may be arranged upstream of the micro lens array 220. In yet another example, the quarter wave plate 228a and half wave plate 228b may be arranged downstream of the optional lenses 230a and 230b. Thus, references herein to collimated radiation, e.g., references to collimated first VCSEL radiation $R_{110a-C}$ and collimated first VCSEL radiation $R_{110a-C}$, may refer to radiation that is both collimated and polarized, e.g., by respective polarizing wave plates 228a and 228b discussed above.

The optional lenses 230a and 230b may be provided to focus the collimated (and/or polarized) radiation toward the vapor cell 106. In particular, the lens 230a focuses collimated (and/or polarized) first VCSEL radiation $R_{110a-C}$ toward a first opening or input location 240a of the vapor cell 106, and the lens 230b focuses collimated (and/or polarized) second VCSEL radiation $R_{110b-C}$ toward a second opening or input location 240b of the vapor cell 106. Micro-lenses 222a and 222b and lenses 230a and 230b may respectively comprise any type or types of lenses, e.g., spherical, aspherical, or cylindrical lenses.

Turning next to FIG. 2B, upstream optics 104 of example device 200b includes the micro lens array 220, optional quarter wave plate 228a, optional half wave plate 228b, optional lenses 230a and 230b and reflective optics (e.g., mirrors) 244. The micro lens array 220 includes the first portion 220a including the set of first micro-lenses 222a to collimate first VCSEL radiation $R_{110a}$ emitted by first VCSEL 110a, and the set of second micro-lenses 222b to collimate second VCSEL radiation $R_{110b}$ emitted by second VCSEL 110b.

As discussed above, the first micro-lenses 222a and second micro-lenses 222b propagate the collimated beams parallel to each other. In this example, the first and second openings or input locations 240a and 240b of the vapor cell 106 (for receiving the first collimated VCSEL radiation $R_{110a-C}$ and second collimated VCSEL radiation $R_{110b-C}$, respectively) are orthogonal to each other. Thus, in this example the collimated first VCSEL radiation $R_{110a}$-c is redirected by a series of reflective optics (e.g., mirrors) 244 arranged between the set of first micro-lenses 222a and the lens 230a. In other examples, the collimated second VCSEL radiation $R_{110b-C}$ (instead of the collimated first VCSEL radiation $R_{110a-C}$) may be redirected by reflective optics 244 (e.g., mirrors), or alternatively both the collimated first VCSEL radiation $R_{110a-C}$ and collimated second VCSEL radiation $R_{110b-C}$ may be redirected by respective reflective optics 244 (e.g., mirrors), to deliver the collimated first VCSEL radiation $R_{110a-C}$ and collimated second VCSEL radiation $R_{110b-C}$ to the respective first and second openings or input locations 240a and 240b of the vapor cell 106.

Turning next to FIG. 2C, upstream optics 104 of example device 200c includes a micro-lens array 250 that directs the collimated first VCSEL radiation $R_{110a-C}$ in a first direction and the collimated second VCSEL radiation $R_{110b-C}$ in a second direction, the second direction different from the first direction. In this example, the first and second VCSELs 110a and 110b are arranged in an alternating pattern on the substrate 114.

The example micro-lens array 250 includes (a) a first set of lenses 252a to (i) collimate first VCSEL radiation $R_{110a}$ emitted by first VCSELs 110a and (ii) direct the collimated first VCSEL radiation $R_{110a-C}$ in the first direction, and (b) a second set of lenses 252b to (i) collimate second VCSEL radiation $R_{110b}$ emitted by second VCSELs 110b and (ii) direct the collimated second VCSEL radiation $R_{110b-C}$ in the second direction non-parallel to the first direction. As shown, the first lenses 252a and second lenses 252b are arranged in an alternating pattern corresponding with the alternating arrangement of the first and second VCSELs 110a and 110b. Respective first lenses 252a may be shaped to steer respective beams of first VCSEL radiation $R_{110a-C}$ toward a first common direction to form a collective beam of collimated first VCSEL radiation $R_{110a-C}$, and respective second lenses 252b may be shaped to steer respective beams of collimated second VCSEL radiation $R_{110b-C}$ toward a second common direction to form a collective beam of collimated second VCSEL radiation $R_{110b-C}$.

One or more reflective optics 244 (e.g., mirrors) may be arranged downstream of the first set of lenses 252a and/or the second set of lenses 252b, but upstream of the vapor cell 106, to deliver the collimated (and/or polarized) first VCSEL radiation $R_{110a-C}$ and collimated (and/or polarized) second VCSEL radiation $R_{110b-C}$ to respective first and second openings or input locations 240a and 240b of the vapor cell 106. In some examples, upstream optics 104 of example device 200c may also include lenses 230a and/or 230b (not shown) to focus the collimated (and/or polarized) first VCSEL radiation $R_{110a-C}$ and/or collimated (and/or polarized) second VCSEL radiation $R_{110b-C}$, e.g., as discussed above.

Figure 3A:
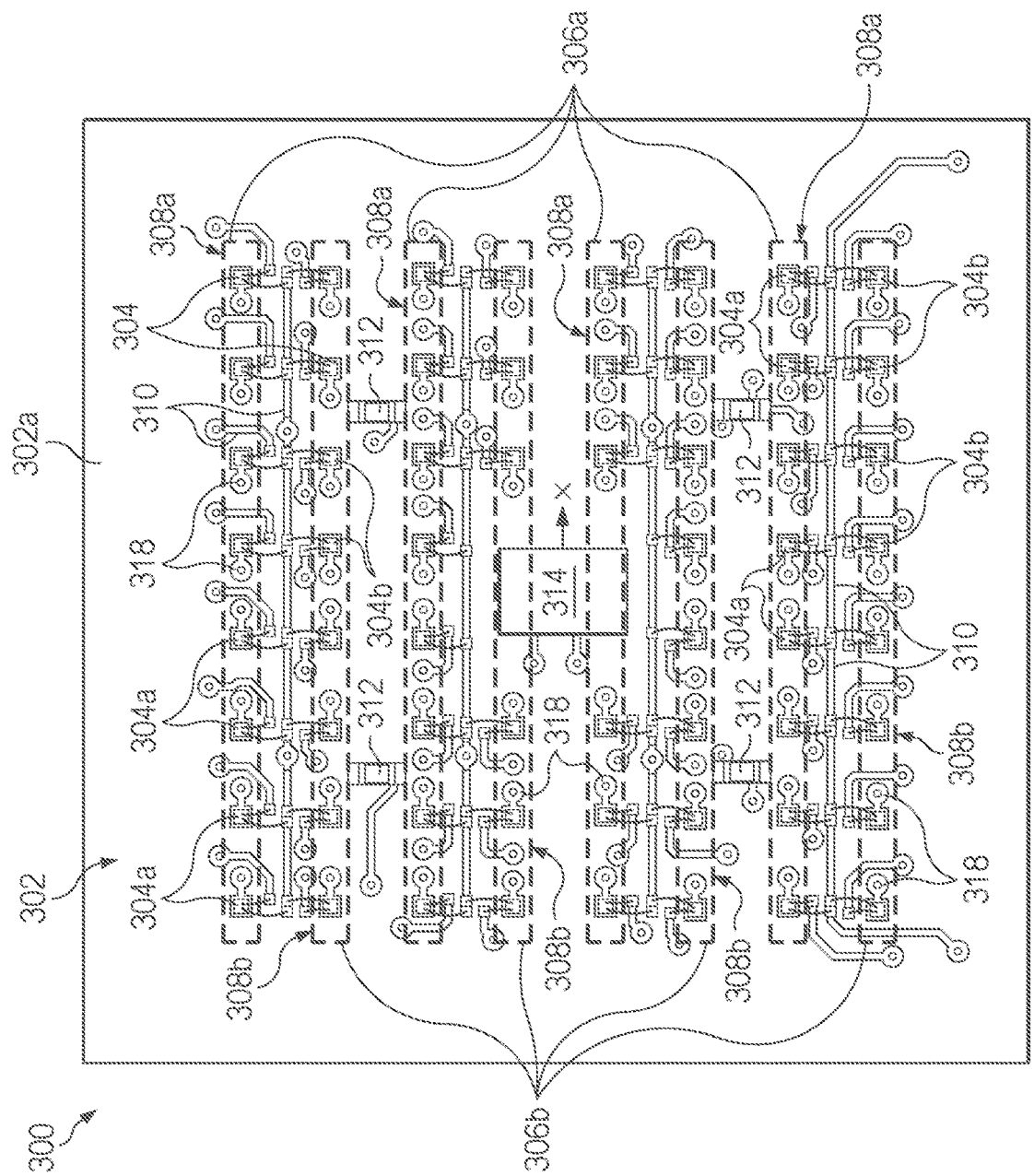
FIGS. 3A and 3B illustrate a top view and a bottom view, respectively, of an example dual-wavelength VCSEL array.
Figure 3B:
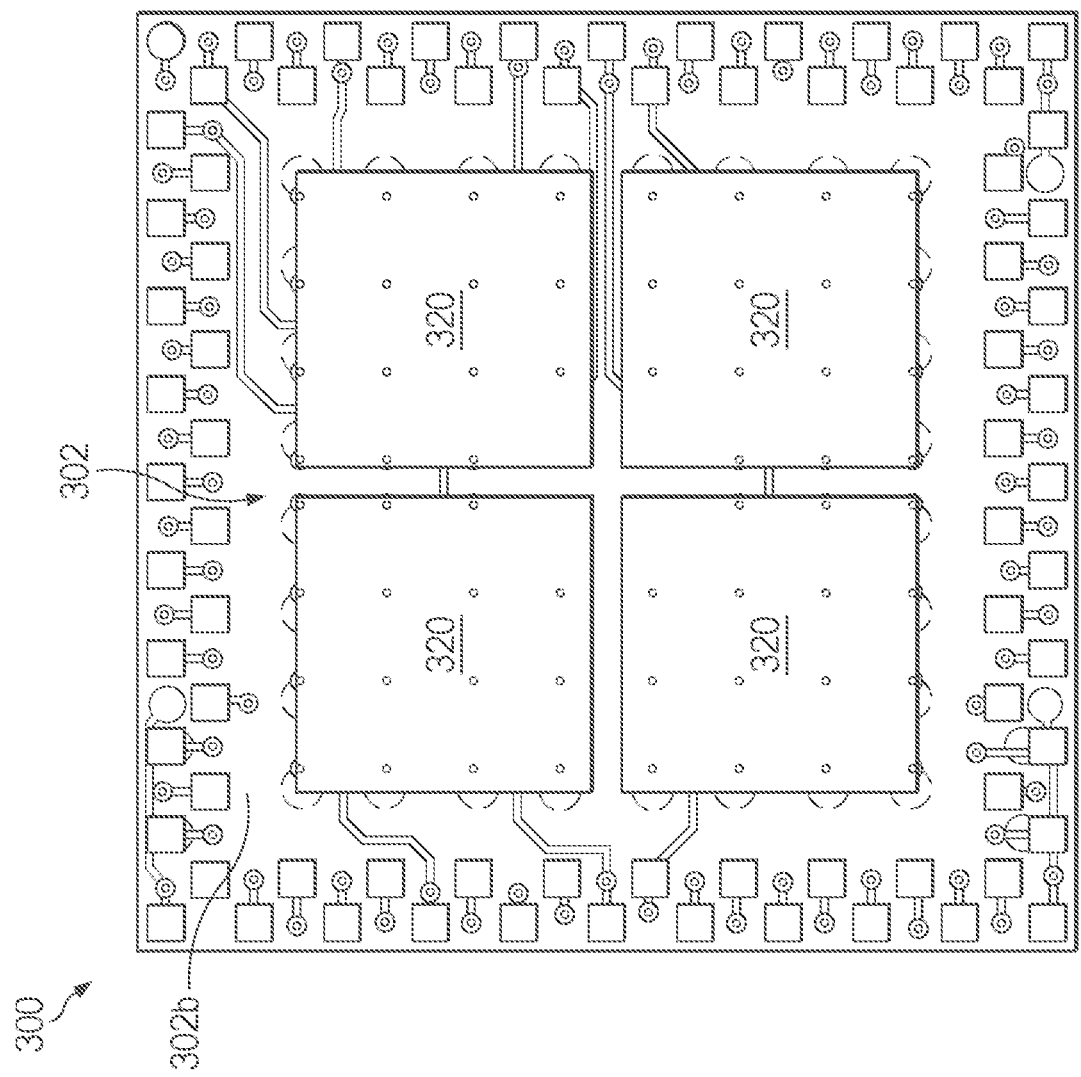

FIGS. 3A and 3B illustrate a top view and a bottom view, respectively, of an example dual-wavelength VCSEL array 300. As shown in FIG. 3A, the example dual-wavelength VCSEL array 300 includes multiple individually addressable (controllable) VCSELs 304 mounted on a front side 302a of a substrate 302. The substrate 302 may comprise a PCB, e.g., comprising glass-reinforced epoxy resin laminate (for example an FR-4 grade material). In one non-limiting example, the dual-wavelength VCSEL array 300 includes 60 individually addressable (controllable) VCSELs 304

The multiple VCSELs 304 include (a) a first VCSEL set 306a including (a) a first VCSEL set 306a including a first plurality of VCSELs 304a to emit first VCSEL radiation at a first wavelength, and (b) a second VCSEL set 306b including a second plurality of second VCSELs 304b to emit second VCSEL radiation at a second wavelength different than the first wavelength. VCSELs 304 may be mounted to the substrate 302 (PCB) using an electrically conductive or electrically non-conductive epoxy. In some examples, the epoxy may be thermally conductive to facilitate heat transfer away from VCSELs 304.

In this example the first VCSELs 304a and the second VCSELs 304b are mounted in alternating rows or "VCSEL banks," including (a) first VCSEL banks 308a including a subset of first VCSELs 304a (e.g., eight first VCSELs 304a) and (b) second VCSEL banks 308b including a subset of second VCSELs 304b (e.g., eight second VCSELs 304b). The VCSELs 304a, 304b in each respective VCSEL bank 308a, 308b are connected to a common anode connection, allowing respective VCSEL banks 308a, 308a to be selectively switched on and off as desired. The illustrated example includes four first VCSEL banks 308a of first VCSELs 304a and four second VCSEL banks 308b of second VCSELs 304b, arranged in an alternating manner. Respective VCSELs 304 (including respective ones of first VCSELs 304a and respective ones of second VCSELs 304b) may be connected to a separate cathode connection, allowing independent current control for individual VCSELs 304, as discussed above.

As shown in FIG. 3A, the dual-wavelength VCSEL array 300 may also include various VCSEL array circuitry and thermal management elements. VCSEL array circuitry may include respective anode and cathode connections 310 (e.g., copper lines), temperature sensors (e.g., thermistors) 312 and a photodetector 314. In some examples, respective anode and cathode connections 310, i.e., connections to anodes and cathodes of respective VCSELs 304, may comprise gold ball bonds (e.g., 20 μm or 25 μm gold ball bonds) between a top surface of a respective VCSEL 304 and the substrate 302.

Temperature sensors 310 may monitor the temperature at respective locations (in this example, four locations) on the dual-wavelength VCSEL array 300. In one example, VCSEL array circuitry may include a processor (e.g., an ASIC) to monitor the device temperature (based on measurement signals generated by one or more of the temperature sensors 310), and use the monitored temperature as feedback for closed-loop current control applied to respective VCSELs 304.

Photodetector 314 may be provided to measure an optical power of radiation emitted by VCSELs 304, for example to detect whether radiation is being emitted and/or to monitor for changes in optical power over time, e.g., related to aging or temperature variations.

In the illustrated example, the dual-wavelength VCSEL array 300 also includes thermally conductive vias 318 formed adjacent respective VCSELs 304, which provide thermally conductive paths from respective VCSELs 304 to thermal pads 320 mounted on a back side 302b of the substrate 302, shown in FIG. 3B. The thermal pads 320 may be soldered to or otherwise mounted on the substrate 302. In some examples a thermoelectric cooler (TEC) 212 (see FIG. 2A) may be mounted to the thermal pads 320 for additional controlled heat removal.

Figure 4A:
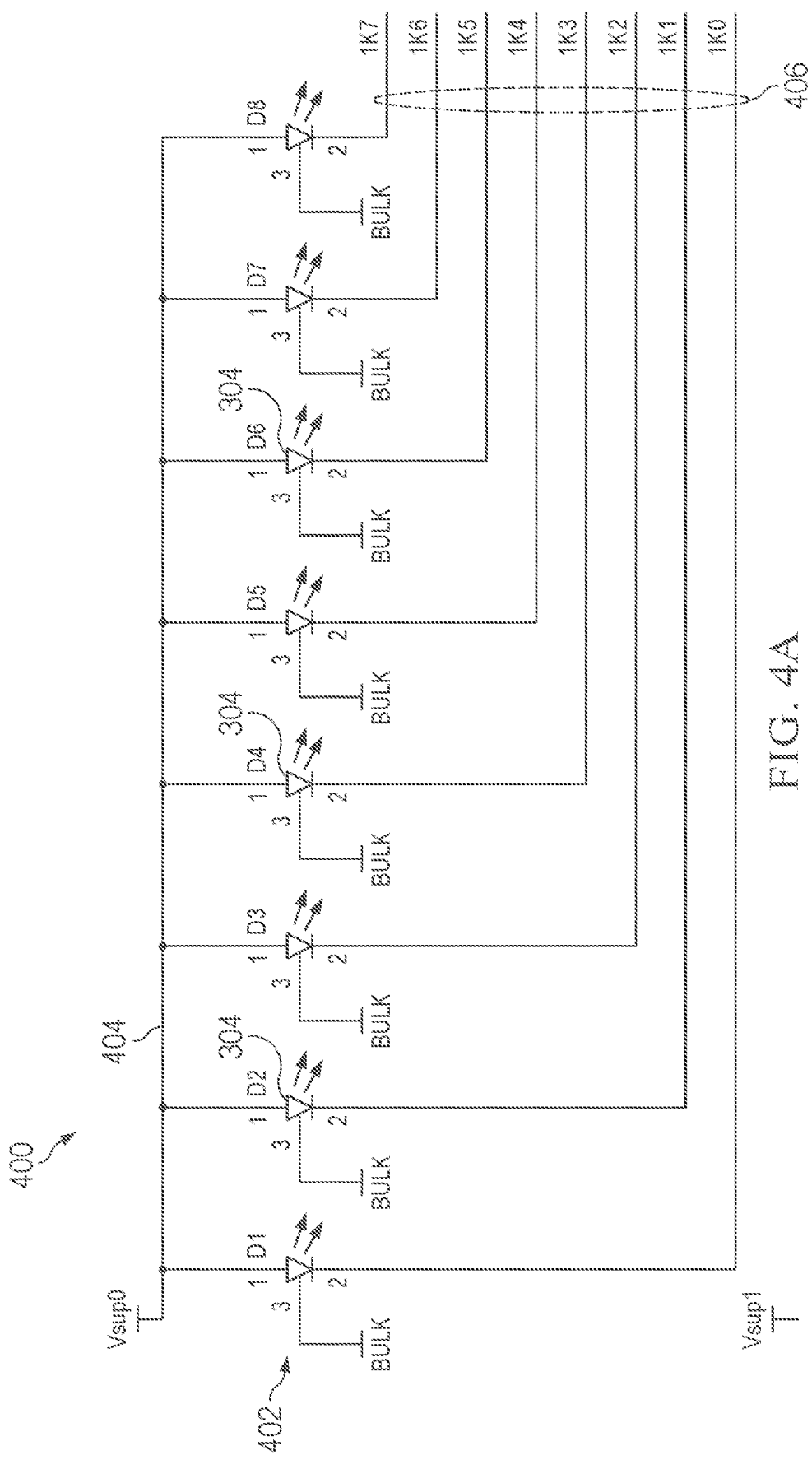
FIG. 4A shows a partial electrical schematic for an example group of VCSELs connected to a common anode connection and separate cathode connections.

FIG. 4A shows a partial electrical schematic 400 for an example VCSEL bank 402, e.g., corresponding with a respective first VCSEL bank 308a or second VCSEL bank 308b of the example dual-wavelength VCSEL array 300 shown in FIGS. 3A-3B. As shown, the example VCSEL bank 402 includes eight VCSELs 304 (e.g., eight first VCSELs 304a or eight second VCSELs 304b) labelled D1-D8 connected to a common anode connection 404 and connected to separate cathode connections 406 allowing independent control of individual VCSELs 304, e.g., to selectively adjust the wavelength emitted by individual VCSELs 304.

Figure 4B:
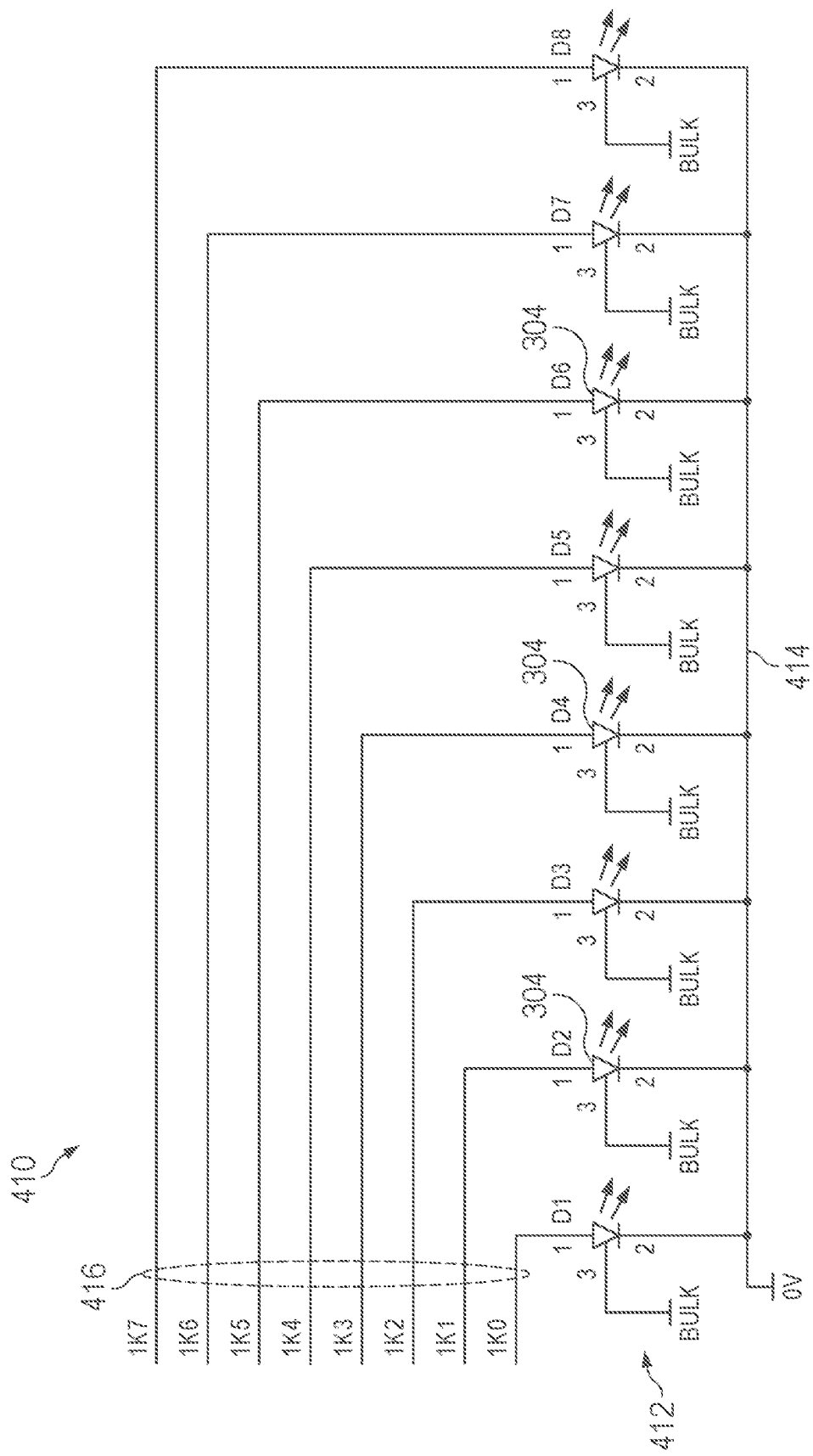
FIG. 4B shows a partial electrical schematic for an example group of VCSELs connected to a common cathode connection and separate anode connections.

FIG. 4B shows a partial electrical schematic 410 for another example VCSEL bank 412, e.g., corresponding with a respective first VCSEL bank 308a or second VCSEL bank 308b of the example dual-wavelength VCSEL array 300 shown in FIGS. 3A-3B. As shown, the example VCSEL bank 412 includes eight VCSELs 304 (e.g., eight first VCSELs 304a or eight second VCSELs 304b) labelled D1-D8 connected to a common cathode connection 414 and connected to separate anode connections 416 allowing independent control of individual VCSELs 304, e.g., to selectively adjust the wavelength emitted by individual VCSELs 304.

As mentioned above, in a dual-wavelength VCSEL array, i.e., a VCSEL array including first VCSELs to emit radiation at a first wavelength and second VCSELs to emit radiation at a second wavelength, the first and second VCSELs may be arranged in any pattern on the respective substrate. In the example shown in FIGS. 3A-3B discussed above, the dual-wavelength VCSEL array 300 includes first VCSELs 304a and second VCSELs 304b arranged in alternating rows on the substrate (PCB) 302.

Figure 5A:
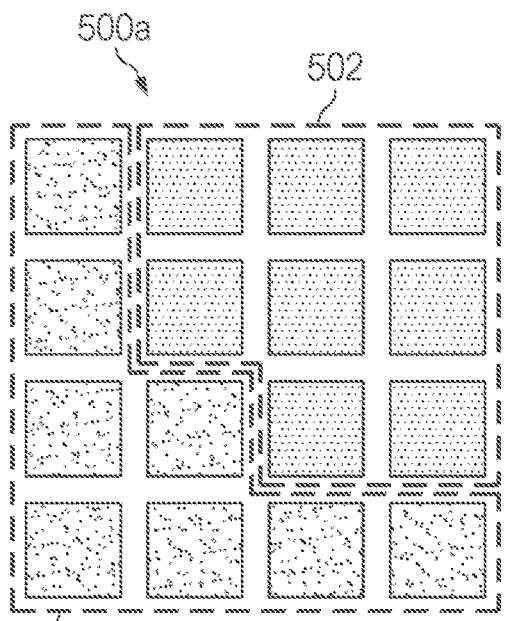
FIGS. 5A-5C illustrate three example arrangements of VCSELs in a dual-wavelength VCSEL array.
Figure 5B:
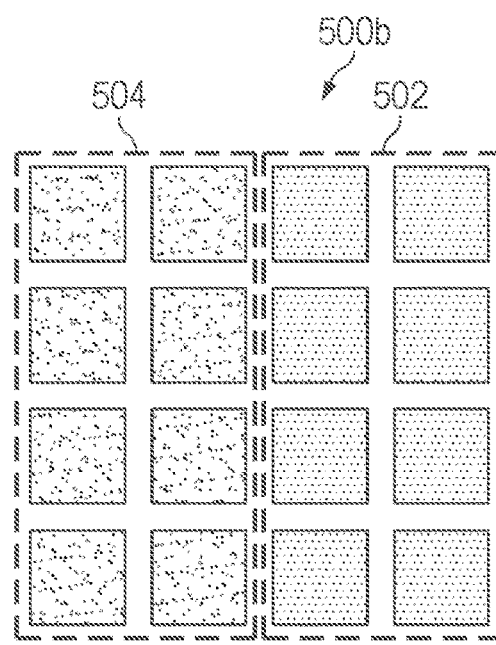
Figure 5C:
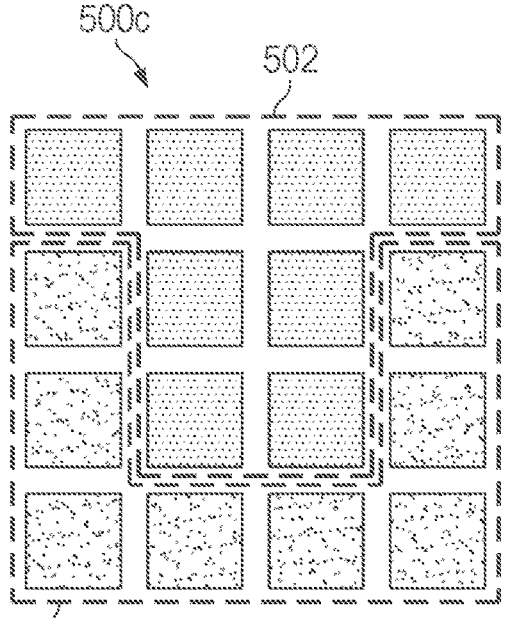

FIGS. 5A-5C illustrate three other example arrangements 500a, 500b, and 500c of VCSELs in a dual-wavelength VCSEL array including eight first VCSELS 502 (for emitting radiation at a first wavelength) and eight second VCSELs 504 (for emitting radiation at a second wavelength). It should be understood that VCSELs may be arranged in any other pattern on a respective substrate, and in any other quantity.

Figure 6A:
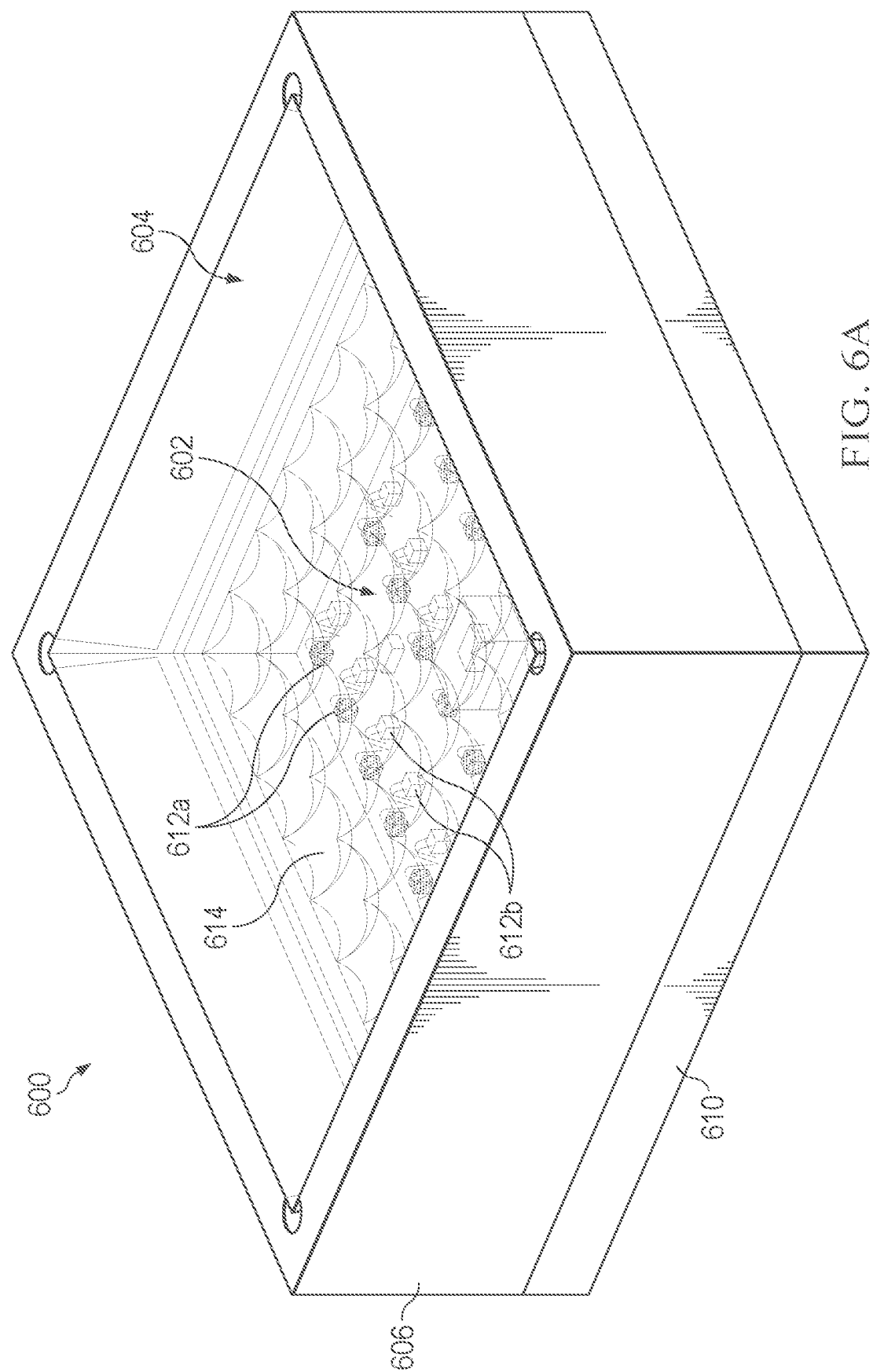
FIG. 6A shows an assembled view.
Figure 6B:
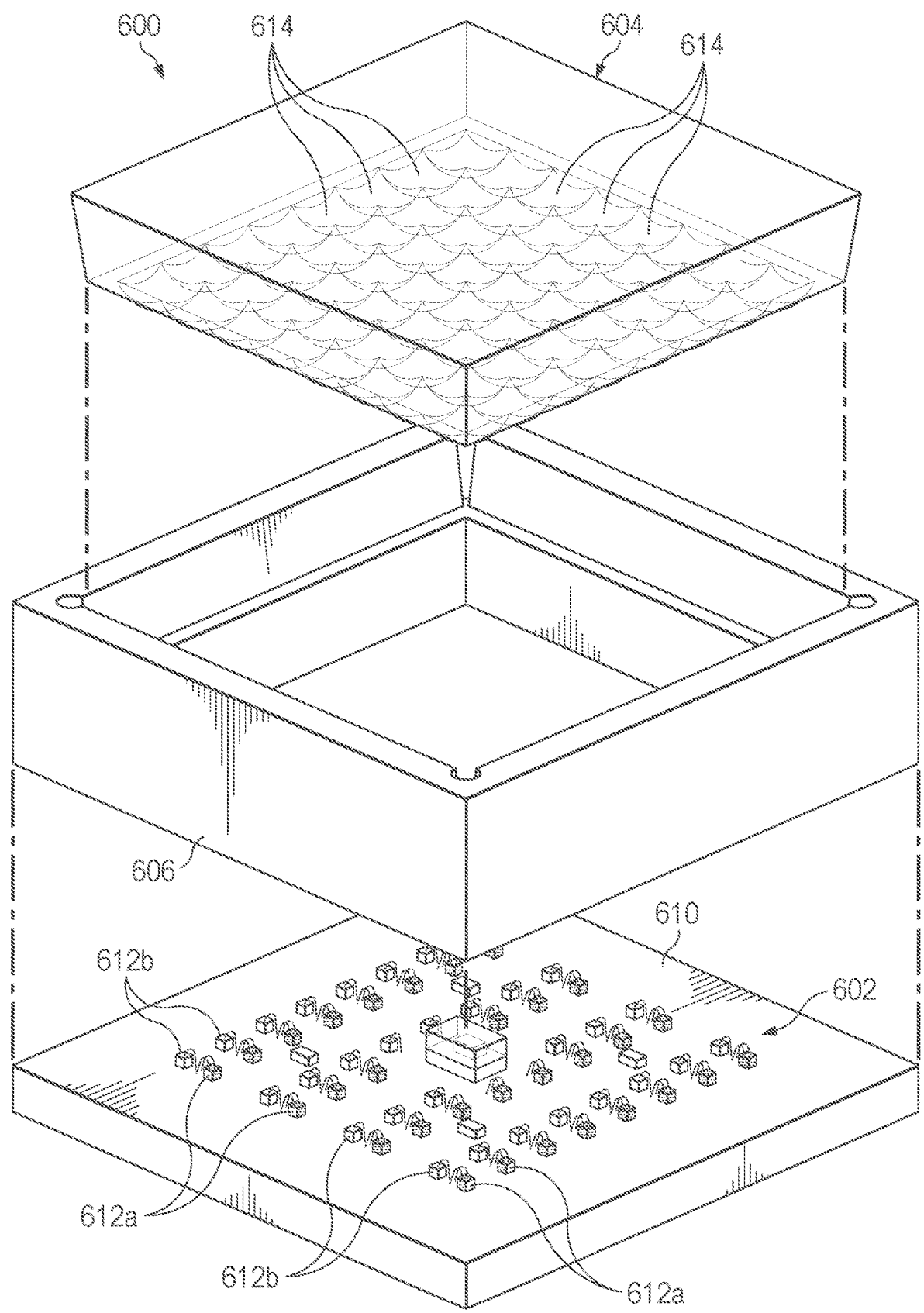
FIG. 6B shows an exploded view, of an example assembly including an example dual-wavelength VCSEL array and micro-lens array supported by a spacer structure (or riser), according to one example.

FIGS. 6A and 6B show an assembled view (FIG. 6A) and an exploded view (FIG. 6B) of an example assembly 600 including an example multiple-wavelength (e.g., dual-wavelength) VCSEL array 602 and micro-lens array 604 supported by a spacer structure (or riser) 606, according to one example. The example assembly 600 may be used in or with any of the devices disclosed herein, e.g., any of example devices 100, 200a, 200b, or 200c.

The example multiple-wavelength (e.g., dual-wavelength) VCSEL array 602 may comprise first VCSELs 612a and second VCSELs 612b mounted on a substrate 610. First VCSELs 612a may emit VCSEL radiation at a first wavelength, and second VCSELs 612b may emit VCSEL radiation at a different second wavelength, to define a dual-wavelength VCSEL array as discussed above. In some examples, substrate 610 may comprise a PCB, e.g., comprising glass-reinforced epoxy resin laminate. In some examples first and second VCSELs 612a and 612b may be surface-mounted to substrate 610, using a surface-mount technology (SMT) process. In one example, the dual-wavelength VCSEL array 602 is formed in a 16×16 mm land grid array (LGA) surface mount technology (SMT) package.

The spacer structure (or "riser") 606 may be mounted to the substrate 610 and may support or hold the micro-lens array 604 spaced apart from the dual-wavelength VCSEL array 602 (in particular, the first and second VCSELs 612a and 612b) mounted on the substrate 610. The spacer structure 606 may hold the micro-lens array 604 spaced apart from the first and second VCSELs 612a and 612b by a defined distance, e.g., to provide desired optical effects of the micro-lens array 604 (and/or further upstream optics) on the respective radiation emitted by the first and second VCSELs 612a and 612b. In some examples, e.g., as shown in FIGS. 6A and 6B, the spacer structure 606 may be formed from an opaque material, and may laterally surround or encircle the dual-wavelength VCSEL array 602 to block out external light.

Figure 7:
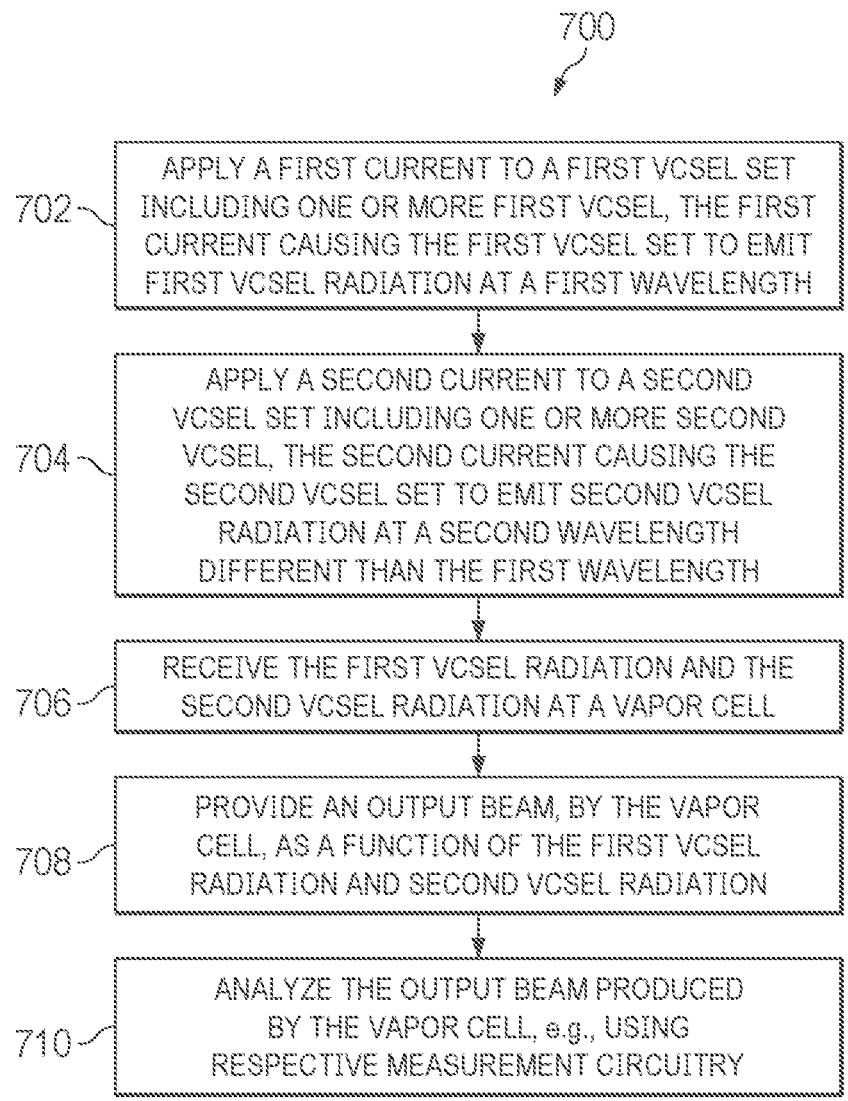
FIG. 7 shows a flowchart of an example method for generating and analyzing radiation from a dual-wavelength VCSEL array.

FIG. 7 shows a flowchart of an example method 700 performed by or using an example device as disclosed herein, e.g., a device including a multiple-wavelength (e.g., dual-wavelength) VCSEL array as discussed above. At 702, a control circuitry coupled to at least one power supply may apply a first current to respective first VCSELs of a first VCSEL set to cause the first VCSEL set to emit first VCSEL radiation at a first defined wavelength. In some examples, the control circuitry may make small adjustments to the current applied to respective first VCSELs to operate the respective first VCSELs at the first defined wavelength. For example, the control circuitry may use an optical injection locking system to shine a master laser at the first VCSELs to force the first VCSELs to operate at the first defined wavelength.

At 704, the control circuitry coupled to the at least one power supply may apply a second current to a respective second VCSELs of a second VCSEL set to cause the second VCSEL set to emit second VCSEL radiation at a second defined wavelength different than the first wavelength. In some examples, the control circuitry may make small adjustments to the current applied to respective second VCSELs to operate the respective second VCSELs at the second defined wavelength. For example, the control circuitry may use an optical injection locking system to shine a master laser at the second VCSELs to force the second VCSELs to operate at the second defined wavelength.

The first and second VCSEL radiation emitted by the first and second VCSEL set, respectively, may be collimated and/or otherwise influenced by respective upstream optics.

At 706, the first VCSEL radiation and second VCSEL radiation are received at a vapor cell, e.g., at defined openings or locations of the vapor cell. At 708, the vapor cell provides an output beam as a function of the received first VCSEL radiation and the received second VCSEL radiation. The output beam may be received by measurement circuitry. At 708, the output beam provided by the vapor cell may be analyzed, e.g., by respective measurement circuitry. In some examples, the output beam provided by the vapor cell may be separated into a first output beam component and a second output beam component orthogonal to the first output beam component, e.g., using polarizing beam splitters and mirrors. The measurement circuitry may measure a first voltage associated with the first output beam component, measure a second voltage associated with the first output beam component, and analyze the first voltage and the second voltage, e.g., to determine a three-dimensional orientation of the relevant device.

The invention claimed is:

1. A device, comprising:
a multiple-wavelength vertical-cavity surface-emitting laser (VCSEL) array provided on a common substrate and including:
a first VCSEL set including one or more first VCSEL to emit first VCSEL radiation at a pump laser wavelength; and
a second VCSEL set including one or more second VCSEL to emit second VCSEL radiation at a probe laser wavelength different than the pump laser wavelength;
upstream optics to (a) collimate the first VCSEL radiation emitted by the first VCSEL set and (b) collimate the second VCSEL radiation emitted by the second VCSEL set;
wherein the collimated first VCSEL radiation defines a pump laser, and the collimated second VCSEL radiation defines a probe laser distinct from the pump laser, such that the both pump laser and probe laser are provided by the VCSEL array provided on the common substrate;
a vapor cell to receive the collimated first VCSEL radiation defining the pump laser and the collimated second VCSEL radiation defining the probe laser and to provide an output beam as a function of the received collimated first VCSEL radiation defining the pump laser and collimated second VCSEL radiation defining the probe laser; and
measurement circuitry to analyze the output beam provided by the vapor cell.

2. The device of claim 1, wherein the probe laser wavelength differs from the pump laser wavelength by an amount in the range of 0.005 nm to 30 nm.

3. The device of claim 1, wherein the probe laser wavelength differs from the pump laser wavelength by an amount in the range of 0.010 nm to 0.025 nm.

4. The device of claim 1, wherein the multiple-wavelength VCSEL array is provided on a printed circuit board.

5. The device of claim 1, wherein the upstream optics comprise a lens array including:
at least one first lens to collimate the first VCSEL radiation emitted by the first VCSEL set; and
at least one second lens to collimate the second VCSEL radiation emitted by the second VCSEL set.

6. The device of claim 5, wherein the device comprises a spacer structure arranged between the substrate and the lens array, wherein the spacer structure holds the lens array spaced apart from the multiple-wavelength VCSEL array provided on the substrate.

7. The device of claim 1, wherein the upstream optics comprise:
a quarter wave plate to polarize the first VCSEL radiation emitted by the first VCSEL set; and
a half wave plate to polarize the second VCSEL radiation emitted by the second VCSEL set.

8. The device of claim 1, wherein the upstream optics include at least one upstream optical element to direct the collimated first VCSEL radiation parallel to the collimated second VCSEL radiation.

9. The device of claim 1, wherein the upstream optics include at least one upstream optical element to direct the collimated first VCSEL radiation non-parallel to the collimated second VCSEL radiation.

10. The device of claim 1, wherein:
the first VCSEL set includes multiple first VCSELs; and
the multiple first VCSELs are individually addressable.

11. The device of claim 10, wherein the multiple first VCSELs are:
connected to a common anode connection and individually addressable via individually addressable cathode connections; or
connected to a common cathode connection and individually addressable via individually addressable anode connections.

12. The device of claim 1, comprising control circuitry to:
apply a first current corresponding with the pump laser wavelength to respective first VCSELs of the first VCSEL set; and
apply a second current corresponding with the probe laser wavelength to respective second VCSELs of the second VCSEL set.

13. The device of claim 1, wherein the first VCSEL set and the second VCSEL set are surface-mounted on a substrate in the form of a land grid array.

14. The device of claim 1, wherein:
the device comprises a magnetometer;
the device includes downstream optics to separate the output beam provided by the vapor cell into a first output beam component and a second output beam component orthogonal to the first output beam component; and
the measurement circuitry to analyze the output beam comprises circuitry to:
measure a first voltage associated with the first output beam component;
measure a second voltage associated with the second output beam component; and
analyze the first voltage and the second voltage to determine a directional orientation.

15. The device of claim 1, wherein:
the device comprises a quantum navigation device; and
the device includes downstream optics to separate the output beam provided by the vapor cell into a first output beam component and a second output beam component orthogonal to the first output beam component; and
the measurement circuitry to analyze the output beam comprises circuitry to analyze the first output beam component and the second output beam component to determine an angle of deviation from a reference point in a defined plane.

16. The device of claim 1, wherein the upstream optics are configured to maintain the collimated first VCSEL radiation separate and spaced apart from the collimated second VCSEL radiation.

17. A device, comprising:
a multiple-wavelength vertical-cavity surface-emitting laser (VCSEL) array provided on a common substrate and including:
one or more first vertical-cavity surface-emitting laser (VCSEL) to emit first VCSEL radiation at a pump laser wavelength; and
one or more second VCSEL to emit second VCSEL radiation at a probe laser wavelength different than the pump laser wavelength;
a lens array including (a) one or more first upstream optical elements to collimate the first VCSEL radiation, the collimated first VCSEL radiation defining a pump laser and (b) one or more second upstream optical elements to collimate the second VCSEL radiation, the collimated second VCSEL radiation defining a probe laser, such that the both pump laser and separate probe laser are provided by the VCSEL array provided on the common substrate;
a vapor cell downstream of the lens array to receive the pump laser defined by the collimated first VCSEL radiation and the probe laser defined by the collimated second VCSEL radiation and to output an output beam; and
measurement circuitry to analyze the output beam.

18. The device of claim 17, wherein:
the lens array is spaced apart from the one or more first VCSEL and the one or more second VCSEL by a spacer structure mounted on the substrate.

19. The device of claim 17, wherein the one or more first VCSEL comprise multiple first VCSELs, wherein the multiple first VCSELs are individually addressable.

20. The device of claim 17, comprising control circuitry to:
apply a first current corresponding with the pump laser wavelength to the one or more first VCSEL; and
apply a second current corresponding with the probe laser wavelength to the one or more second VCSEL.

21. A method, comprising:
applying a first current to a first VCSEL set including one or more first VCSEL of a VCSEL array provided on a substrate, the first current causing the first VCSEL set to emit first VCSEL radiation at a pump laser wavelength; and
applying a second current to a second VCSEL set including one or more second VCSEL of the VCSEL array provided on the substrate, the second current causing the second VCSEL set to emit second VCSEL radiation at a probe laser wavelength different than the pump laser wavelength;
collimating the first VCSEL radiation emitted by the first VCSEL set, wherein the collimated first VCSEL radiation defines a pump laser;
collimating the second VCSEL radiation emitted by the second VCSEL set, wherein the collimated second VCSEL radiation defines a probe laser;
receiving the pump laser defined by the collimated first VCSEL radiation and the probe laser defined by the collimated second VCSEL radiation at a vapor cell;
providing an output beam, by the vapor cell, as a function of the pump laser defined by the collimated first VCSEL radiation and probe laser defined by the collimated second VCSEL radiation;
analyzing the output beam produced by the vapor cell.

22. The method of claim 21, comprising separating the output beam provided by the vapor cell into a first output beam component and a second output beam component orthogonal to the first output beam component;
wherein analyzing the output beam produced by the vapor cell comprises:
measuring a first voltage associated with the first output beam component;
measuring a second voltage associated with the second output beam component; and
analyzing the first voltage and the second voltage.

23. The method of claim 21, wherein:
applying the first current to the first VCSEL set to cause the first VCSEL set to emit first VCSEL radiation at the pump laser wavelength comprises performing an optical injection locking technique to control respective first VCSELs to emit first VCSEL radiation at the pump laser wavelength; and
applying the second current to the first VCSEL set to cause the second VCSEL set to emit second VCSEL radiation at the probe laser wavelength comprises performing an optical injection locking technique to control respective second VCSELs to emit second VCSEL radiation at the probe laser wavelength.

* * * * *